(12) United States Patent
Bakeer et al.

(10) Patent No.: US 10,567,063 B1
(45) Date of Patent: Feb. 18, 2020

(54) PHASE SHIFT MODULE WITH AN ENHANCED FREQUENCY MULTIPLIER AND TEMPERATURE COMPENSATION IN LOCAL OSCILLATOR PATH

(71) Applicant: Analog Devices International Unlimited Company, Limerick (IE)

(72) Inventors: Hany Gamal Eldin Mohamed Bakeer, Cairo (EG); Ahmed Mohamed Attia Zamzam, Cairo (EG); Mohamed Ahmed Youssef Abdalla, Cairo (EG); Ahmed I. Khalil, Dracut, MA (US)

(73) Assignee: ANALOG DEVICES INTERNATIONAL UNLIMITED COMPANY, Limerick (IE)

( * ) Notice: Subject to any disclaimer, the term of this patent is extended or adjusted under 35 U.S.C. 154(b) by 0 days.

(21) Appl. No.: 16/359,856

(22) Filed: Mar. 20, 2019

(51) Int. Cl.
*H04B 7/06* (2006.01)

(52) U.S. Cl.
CPC .................. *H04B 7/0682* (2013.01)

(58) Field of Classification Search
CPC .................................... H04B 7/0682
See application file for complete search history.

(56) References Cited

U.S. PATENT DOCUMENTS

| | | | |
|---|---|---|---|
| 3,710,329 A | 1/1973 | Mailloux et al. | |
| 4,308,539 A | 12/1981 | Birch | |
| 4,388,626 A | 6/1983 | Gans | |
| 5,140,198 A * | 8/1992 | Atherly | H03D 7/166 327/113 |
| 5,596,417 A * | 1/1997 | Kimura | H04N 9/873 386/202 |
| 5,764,187 A | 6/1998 | Rudish et al. | |

(Continued)

FOREIGN PATENT DOCUMENTS

| | | |
|---|---|---|
| EP | 0417689 A2 | 9/1990 |
| EP | 2396851 B1 | 2/2010 |

OTHER PUBLICATIONS

Shahramian et al., *A Fully Integrated Scalable W-Band Phased-Array Module with Integrated Antennas, Self-Alignment and Self-Test*, ISSCC 2019, Session 4, mm-Wave Radios for 5G and Beyond, 4.6, 2019 IEEE International Solid-State Circuits Conference, 978-1-5090-4940-0/18 © 2019 IEEE, 3 pages.

(Continued)

*Primary Examiner* — Siu M Lee
(74) *Attorney, Agent, or Firm* — Patent Capital Group

(57) ABSTRACT

Systems and methods for providing phase shifting in antenna arrays, such as phased antenna arrays of 5G cellular technology, are disclosed. In one aspect, an example phase shift module may include a phase shifter and a frequency multiplier. The phase shifter is configured to receive an LOcal oscillator (LO) signal and output a signal that is phase-shifted by a desired phase shift with respect to the LO signal. The frequency multiplier may be an enhanced frequency multiplier, configured to use not only the phase-shifted signal but also an inverted version of the phase-shifted signal to generate a frequency-multiplied signal having a frequency that is a multiple of the LO signal frequency. In another aspect, an example phase shift module may be configured to apply to an LO signal a phase shift that takes into consideration variations of phase shift over temperature.

25 Claims, 9 Drawing Sheets

(56) References Cited

U.S. PATENT DOCUMENTS

| | | | |
|---|---|---|---|
| 6,593,881 | B2 | 7/2003 | Vail et al. |
| 6,788,744 | B1 * | 9/2004 | Hirama ............... H03G 3/3042 |
| | | | 375/146 |
| 6,824,307 | B2 * | 11/2004 | Vail ......................... H01Q 1/02 |
| | | | 374/183 |
| 9,673,846 | B2 | 6/2017 | Hageman et al. |
| 10,107,625 | B2 * | 10/2018 | Bhandari ........... G01C 19/5776 |
| 2004/0087294 | A1 | 5/2004 | Wang |
| 2005/0195103 | A1 | 9/2005 | Davis et al. |
| 2006/0071728 | A1 * | 4/2006 | Chen ...................... H03L 1/027 |
| | | | 331/158 |
| 2006/0152257 | A1 * | 7/2006 | Yamamoto ............ H03B 19/14 |
| | | | 327/116 |
| 2009/0232191 | A1 * | 9/2009 | Gupta ................ H04L 27/2096 |
| | | | 375/216 |
| 2013/0147528 | A1 * | 6/2013 | Makinwa ................ H03L 1/022 |
| | | | 327/141 |
| 2016/0218429 | A1 | 7/2016 | Klemes |

OTHER PUBLICATIONS

Heng et al., *Session 4 Overview: mm-Wave Radios for 5G and Beyond*, ISSCC 2018, Session 4, mm-Wave Radios for 5G and Beyond / Overview, 2018 IEEE International Solid-State Circuits Conference, 978-1-5090-4940-1/18 © 2018 IEEE, 20 pages.
*A Varactor Controlled Phase Shifter for PCS Base Station Applications*, Application Note, Skyworks Solutions, Inc., Aug. 13, 2009, 9 pages.

* cited by examiner

US 10,567,063 B1

PHASE SHIFT MODULE WITH AN ENHANCED FREQUENCY MULTIPLIER AND TEMPERATURE COMPENSATION IN LOCAL OSCILLATOR PATH

TECHNICAL FIELD OF THE DISCLOSURE

The present disclosure generally relates to radio frequency (RF) systems and, more particularly, to phase shift modules used in such systems.

BACKGROUND

Radio systems are systems that transmit and receive signals in the form of electromagnetic waves in the RF range of approximately 3 kiloHertz (kHz) to 300 gigaHertz (GHz). Radio systems are commonly used for wireless communications, with cellular/wireless mobile technology being a prominent example.

A phase shift module is an RF network module which provides a controllable phase shift of an RF signal. Phase shifters may be used in phased arrays, where, in antenna theory, a phased array usually refers to an electronically scanned array of antenna elements which creates a beam of radio waves that can be electronically steered to point in different directions without moving the antennas. In an array antenna, the RF current from the transmitter is fed to the individual antennas with the correct phase relationship so that the radio waves from the separate antennas add together to increase the radiation in a desired direction, while cancelling to suppress radiation in undesired directions. In a phased array, the power from the transmitter is fed to the antennas through phase shifters, controlled by a computer system, which can alter the phase electronically, thus steering the beam of radio waves to a different direction.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Overview

Figure 1:
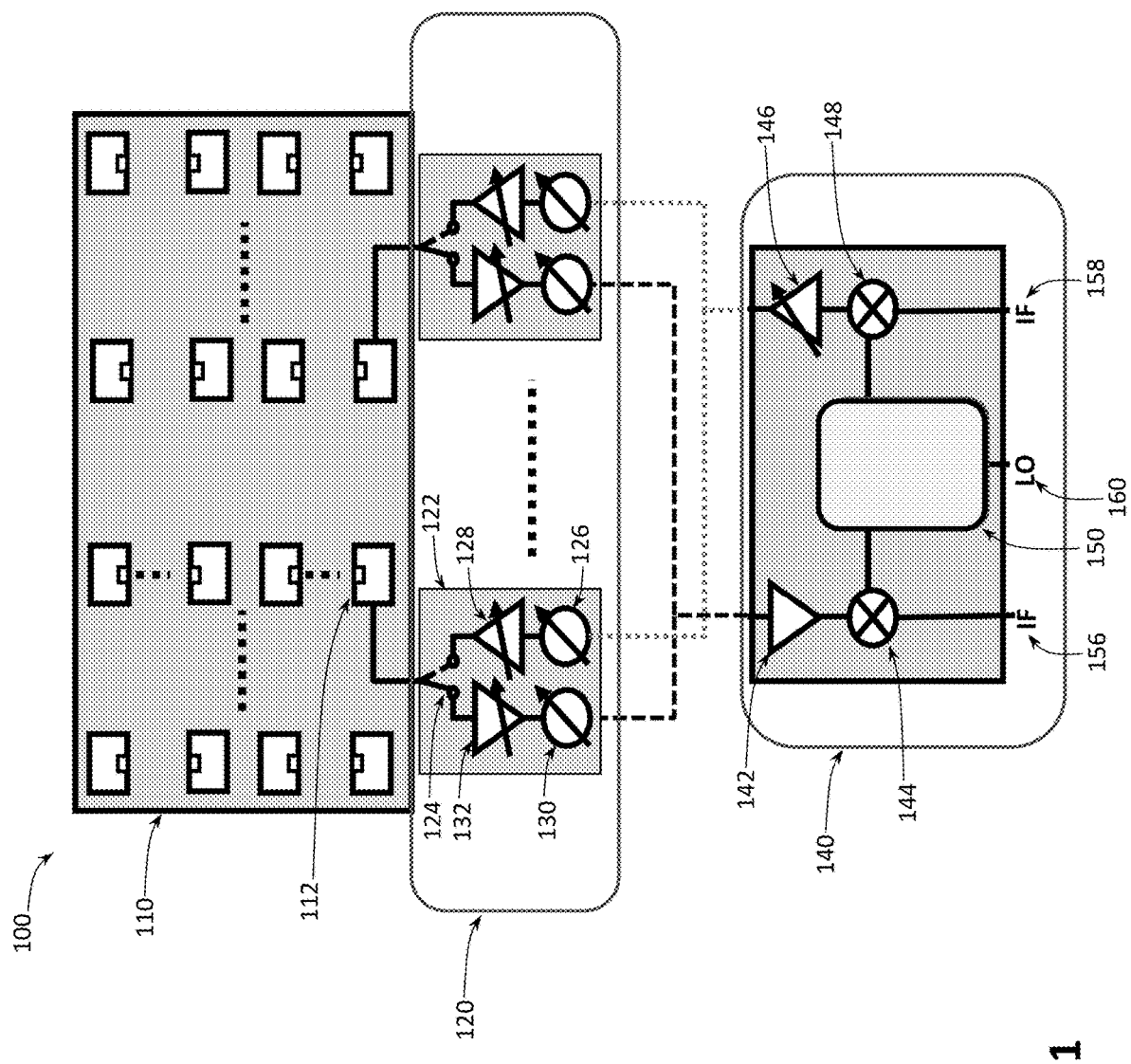
FIG. 1 provides a schematic illustration of an antenna apparatus with a phase shift module in the local oscillator (LO) path, according to some embodiments of the present disclosure.

The systems, methods and devices of this disclosure each have several innovative aspects, no single one of which is solely responsible for the all of the desirable attributes disclosed herein. Details of one or more implementations of the subject matter described in this specification are set forth in the description below and the accompanying drawings.

For purposes of illustrating phase shift modules in RF systems, proposed herein, it might be useful to first understand phenomena that may come into play in such systems. The following foundational information may be viewed as a basis from which the present disclosure may be properly explained. Such information is offered for purposes of explanation only and, accordingly, should not be construed in any way to limit the broad scope of the present disclosure and its potential applications.

In context of radio systems, an antenna is a device that serves as an interface between radio waves propagating wirelessly through space and electric currents moving in metal conductors used with a transmitter or a receiver. During transmission, a radio transmitter may supply an electric current to antenna's terminals, and the antenna may radiate the energy from the current as radio waves. During reception, an antenna may intercept some of the power of a wireless radio wave in order to produce an electric current at its terminals, which current may subsequently be amplified by the receiver. Antennas are essential components of all radio equipment, and are used in radio broadcasting, broadcast television, two-way radio, communications receivers, radar, cell phones, satellite communications and other devices.

An antenna with a single antenna element will typically broadcast a radiation pattern that radiates equally in all directions in a spherical wavefront. Phased antenna arrays (also commonly referred to as "phase arrays") generally refer to a collection of antennas (where individual antennas are commonly referred to as "antenna elements") that are used to focus electromagnetic energy in a particular direction, thereby creating a main beam. Phased arrays offer numerous advantages over single-antenna systems, such as high gain, ability to perform directional steering, and simultaneous communication. Therefore, phased arrays are being used more frequently in a myriad of different applications, such as in mobile technology, cellular telephone and data, Wi-Fi technology, automotive radars, and airplane radars.

Each individual antenna element of a phased array may radiate in a spherical pattern, but, collectively, a plurality of such antenna elements may generate a wavefront in a particular direction (such a wavefront commonly referred to as a "main beam") through constructive and destructive interference. Namely, by carefully controlling the phase of signals radiated by different antenna elements, radiation patterns of different antenna elements may constructively interfere in a desired direction, creating the main beam in that direction, while interfering destructively in several other directions other than the direction of the main beam. Therefore, a phased array typically includes phase shift modules (also commonly referred to as "phase shifters"), configured to control the phase of signals radiated by different antenna elements.

In a phased array as described above, the precision of the direction of the main beam is highly dependent on the precision of the relative phase between different antenna elements. Unfortunately, careful control of the phase of signals radiated by different antenna elements is not a trivial task and phase errors may arise due to different reasons. One reason that makes careful phase control challenging is that phase shifters themselves may introduce significant losses affecting operation of a phased array system, which may lead to degraded gain and linearity performance, and may increase power consumption, e.g., due to the need for additional amplification stages. Another reason that makes careful phase control challenging is that phase shifters often exhibit temperature variations, i.e., for a given phase shift that may be desired, the amount of phase shift actually realized may be different at different temperatures, leading to phase errors and degraded array performance. The challenges become more severe as the range of phase shifts that a phase shifter should be able to provide increases, with the latest RF systems requiring the ability to provide phase shifts in the full range of 360 degrees. The challenges are exacerbated even further as the number of RF network modules which need to be phase-synchronized increases. For example, in fifth generation cellular technology (5G) phased antenna arrays, synchronizing the phase of the various up/down converter (UDC) paths is important in scenarios where multiple streams are to be combined together to form one stream, which may help scale the array size and/or power and increase signal-to-noise ratio (SNR) per user.

A common conventional approach to being able to carefully controlling phase shift involves performing factory calibrations, to be performed before RF modules are deployed in the field. However, such factory calibrations are expensive, time-consuming, and lack the flexibility needed to calibrate modules in the field.

Various embodiments of the present disclosure provide systems and methods that aim to improve on one or more challenges described above in enabling phase shifting in antenna arrays, such as, but not limited to, phased antenna arrays of 5G cellular technology.

In one aspect of the present disclosure, an example phase shift module includes a phase shifter and a frequency multiplier. The phase shifter is configured to receive an LO signal and output a signal that is phase-shifted by a desired phase shift PS with respect to the LO signal. The frequency multiplier is configured to use the phase-shifted signal as well as the inverted phase-shifted signal (i.e., a signal that is an inverted version of the phase-shifted signal) to generate a frequency-multiplied signal having a frequency that is a multiple K of a frequency of the LO signal (where K is greater than 1). Because the frequency multiplier uses not only the phase-shifted signal itself, but also the inverted version thereof, it may be referred to as an "enhanced frequency multiplier." Because the phase shifter applies phase shift to an LO signal, it may be described as being provided in the LO path (i.e., in the path of the LO signal, which is between the LO and the one or more frequency mixers that use the LO signal to perform up or down conversion). This is in contrast to any phase shifters that may be implemented in a signal path (i.e., in the path of the signal to be transmitted), e.g., after a mixer has performed frequency upconversion by mixing a signal to be transmitted with an LO signal, or anywhere in the path of the signal to be transmitted before it gets to the mixer for frequency upconversion.

In another aspect of the present disclosure, an example phase shift module is provided in the LO path (i.e., the phase shift applied by the phase shift module is applied to an LO signal) and is configured to apply to an LO signal a phase shift that takes into consideration variations of phase shift over temperature. To that end, an example antenna apparatus may include a temperature compensation circuit configured to determine a temperature compensation to be applied to a phase shift to be applied by the phase shift module, and the phase shift module may be configured to apply the phase shift to an LO signal to generate a phase-shifted LO signal, where the phase shift based on the temperature compensation determined by the temperature compensation circuit and a target phase shift to be applied. One or more frequency mixers of the UDC circuit may then be configured to perform frequency mixing using the phase-shifted LO signal generated by the phase shift module.

Phase shift modules with enhanced frequency multipliers and/or temperature compensation as described herein may provide a number of advantages (e.g., reduce losses associated with phase shifters, reduce negative impacts of phase shifting on RF signal quality, and enable built-in calibration solutions, e.g., to achieve LO phase synchronization between different UDCs used in 5G phased arrays), some of which are highlighted below.

Using a frequency multiplier may allow reducing the range of phase shifts that a phase shifter needs to be able to provide by a factor of 1/K. The fact that the enhanced frequency multiplier uses an inverted version of a phase-shifted signal may further allow reducing the range by half. As a result, phase shift modules with enhanced frequency multipliers as described herein may allow significantly decreasing the range of phase shifts that a phase shifter should be able to provide, advantageously reducing losses associated with phase shifters. For example, a phase shift module may use a phase shifter that is able to provide a phase shift in the range of, maximum, 90 degrees (e.g., a phase shift between 0 and 90 degrees) and an enhanced frequency multiplier that is a frequency doubler (i.e., K=2) to be able to achieve a 360 degrees phase shift. In another example, a phase shift module may use a phase shifter that is able to provide a phase shift in the range of, maximum, 45 degrees (e.g., a phase shift between 0 and 45 degrees) and an enhanced frequency multiplier that is a frequency quadrupler (i.e., K=4) to be able to achieve a 360 degrees phase shift.

In addition, providing a phase shift module in the LO path, as opposed to providing it in the signal path, including implementing temperature compensation for phase shift variations in the LO path, may advantageously reduce negative impacts of phase shifting on RF signal quality.

Furthermore, phase shift modules as described herein may be particularly suitable for enabling built-in calibration solutions which can be performed in the field, eliminating the need for, or at least reducing the requirements of, the expensive factory calibrations. For example, phase shift modules as described herein may be used for performing phased array calibration to achieve LO phase synchronization (e.g., to compensate for, or reduce or eliminate, phase mismatch) between different UDC circuits used in 5G phased arrays.

In various embodiments, the term "UDC circuit" may be used to include a frequency conversion circuit as such (e.g., a frequency mixer configured to perform upconversion to RF signals for wireless transmission, a frequency mixer configured to perform downconversion of received RF signals, or both), as well as any other components that may be included in a broader meaning of this term, such as filters, analog-to-digital converters (ADCs), digital-to-analog converters (DACs), transformers, and other circuit elements typically used in association with frequency mixers. In all of these variations, the term "UDC circuit" covers implementations where the UDC circuit only includes circuit elements related to a transmit (TX) path (e.g., only an upconversion mixer but not a downconversion mixer; in such implementations the UDC circuit may be used as/in an RF transmitter for generating RF signals for transmission, e.g., the UDC circuit may enable a calibration probe or an antenna element of the antenna array that is connected to the UDC circuit to act, or be used, as a transmitter), implementations where the UDC circuit only includes circuit elements related to a receive (RX) path (e.g., only an downconversion mixer but not an upconversion mixer; in such implementations the UDC circuit may be used as/in an RF receiver to downconvert received RF signals, e.g., the UDC circuit may enable a calibration probe or an antenna element of the antenna array that is connected to the UDC circuit to act, or be used, as a receiver), as well as implementations where the UDC circuit includes, both, circuit elements of the TX path and circuit elements of the RX path (e.g., both the upconversion mixer and the downconversion mixer; in such implementations the UDC circuit may be used as/in an RF transceiver, e.g., the UDC circuit may enable a calibration probe or an antenna element of the antenna array that is connected to the UDC circuit to act, or be used, as a transceiver).

As will be appreciated by one skilled in the art, aspects of the present disclosure, in particular aspects of phase shift modules with enhanced frequency multipliers and/or temperature compensation as described herein, may be embodied in various manners—e.g. as a method, a system, a computer program product, or a computer-readable storage medium. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Functions described in this disclosure may be implemented as an algorithm executed by one or more hardware processing units, e.g. one or more microprocessors, of one or more computers. In various embodiments, different steps and portions of the steps of any methods described herein may be performed by different processing units. Furthermore, aspects of the present disclosure may take the form of a computer program product embodied in one or more computer-readable medium(s), preferably non-transitory, having computer-readable program code embodied, e.g., stored, thereon. In various embodiments, such a computer program may, for example, be downloaded (updated) to the existing devices and systems (e.g. to the existing cable communication transmitters, receivers, and/or their controllers, etc.) or be stored upon manufacturing of these devices and systems.

The following detailed description presents various descriptions of specific certain embodiments. However, the innovations described herein can be embodied in a multitude of different ways, for example, as defined and covered by the claims or select examples. In the following description, reference is made to the drawings where like reference numerals can indicate identical or functionally similar elements. It will be understood that elements illustrated in the drawings are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The description may use the phrases "in an embodiment" or "in embodiments," which may each refer to one or more of the same or different embodiments. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner. Various aspects of the illustrative embodiments are described using terms commonly employed by those skilled in the art to convey the substance of their work to others skilled in the art. The terms "substantially," "approximately," "about," etc., may be used to generally refer to being within +/−20% of a target value based on the context of a particular value as described herein or as known in the art. For the purposes of the present disclosure, the phrase "A and/or B" or notation "A/B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A, B, and/or C).

Example Antenna Apparatus with a Phase Shift Module in LO Path

FIG. 1 provides a schematic illustration of an antenna apparatus 100, e.g., a phased array system/apparatus, according to some embodiments of the present disclosure. As shown in FIG. 1, the system 100 may include an antenna array 110, a beamformer array 120, and a UDC circuit 140.

In general, the antenna array 110 may include one or more, typically a plurality of, antenna elements 112 (only one of which is labeled with a reference numeral in FIG. 1 in order to not clutter the drawing). In various embodiments, the antenna elements 112 may be radiating elements or passive elements. For example, the antenna elements 112 may include dipoles, open-ended waveguides, slotted waveguides, microstrip antennas, and the like. In some embodiments, the antenna elements 112 may include any suitable elements configured to wirelessly transmit and/or receive RF signals. Although some embodiments shown in the present drawings illustrate a certain number of antenna elements 112, it is appreciated that these embodiments may be implemented with an array of any number of two or more antenna elements. Furthermore, although the disclosure may discuss certain embodiments as one type of antenna array, it is understood that the embodiments disclosed herein may be implemented with different types of antenna arrays, such as time domain beamformers, frequency domain beamformers, dynamic antenna arrays, antenna arrays, passive antenna arrays, and the like.

Similarly, the beamformer array 120 may include one or more, typically a plurality of, beamformers 122 (only one of which is labeled with a reference numeral in FIG. 1 in order to not clutter the drawing). The beamformers 122 may be seen as transceivers (e.g., devices which may transmit and/or receive signals, in this case—RF signals) that feed to antenna elements 112. In some embodiments, a single beamformer 122 of the beamformer array 120 is associated with a single antenna element 112 of the antenna array 110 in a one-to-one correspondence (i.e., different beamformers 122 are associated with different antenna elements 112). In other embodiments, more than one beamformers 122 may be associated with a single antenna element 112, e.g., two beamformers 122 may be associated with a single antenna element 112 if, e.g., such antenna element is a dual polarization antenna element.

In some embodiments, each of the beamformers 122 may include a switch 124 to switch the path from the corresponding antenna element 112 to the receiver or the transmitter path. Although not specifically shown in FIG. 1, in some embodiments, each of the beamformers 122 may also include another switch to switch the path from a signal processor (also not shown) to the receiver or the transmitter path. As shown in FIG. 1, in some embodiments, the transmitter path (TX path) of each of the beamformers 122 may include a phase shifter 126 and a variable (e.g., programmable) gain amplifier 128, while the receiver path (RX path) may include a phase adjusted 130 and a variable (e.g., programmable) gain amplifier 132. The phase shifter 126 may be configured to adjust the phase of the RF signal to be transmitted (TX signal) by the antenna element 112 and the variable gain amplifier 128 may be configured to adjust the amplitude of the TX signal to be transmitted by the antenna element 112. Similarly, the phase shifter 130 and the variable gain amplifier 132 may be configured to adjust the RF signal received (RX signal) by the antenna element 112 before providing the RX signal to further circuitry, e.g., to the UDC circuit 140, to the signal processor (not shown), etc. The beamformers 122 may be considered to be "in the RF path" of the antenna apparatus 100 because the signals traversing the beamformers 122 are RF signals (i.e., TX signals which may traverse the beamformers 122 are RF signals upconverted by the UDC circuit 140 from lower frequency signals, e.g., from intermediate frequency (IF) signals or from baseband signals, while RX signals which may traverse the beamformers 122 are RF signals which have not yet been downconverted by the UDC circuit 140 to lower frequency signals, e.g., to IF signals or to baseband signals).

Although a switch is shown in FIG. 1 to switch from the transmitter path to the receive path (i.e., the switch 124), in other embodiments of the beamformer 122, other components can be used, such as a duplexer. Furthermore, although FIG. 1 illustrates an embodiment where the beamformers 122 include the phase shifters 126, 130 (which may also be referred to as "phase adjusters") and the variable gain amplifiers 128, 132, in other embodiments, any of the beamformers 122 may include other components to adjust the magnitude and/or the phase of the TX and/or RX signals. In yet further embodiments, one or more of the beamformers 122 may not include the phase shifter 126 and/or the phase shifter 130 because the desired phase adjustment may, alternatively, be performed using a phase shift module in the LO path, as described below. In other embodiments, phase adjustment performed in the LO path using a phase shift module with an enhanced frequency multiplier as described below may be combined with phase adjustment performed in the RF path using the phase shifters of the beamformers 122.

Turning to the details of the UDC circuit, in general, the UDC circuit 140 may include an upconverter and/or downconverter circuitry, i.e., in various embodiments, the UDC circuit 140 may include 1) an upconverter circuit but no downconverter circuit, 2) a downconverter circuit but no upconverter circuit, or 3) both an upconverter circuit and a downconverter circuit. As shown in FIG. 1, the downconverter circuit of the UDC circuit 140 may include an amplifier 142 and a mixer 144, while the upconverter circuit of the UDC circuit 140 may include an amplifier 146 and a mixer 148. Furthermore, the UDC circuit 140 may further include a phase shift module 150, described in greater detail below.

In some embodiments, a single UDC circuit 140 may provide upconverted RF signals to and/or receive RF signals to be downconverted from any one of the beamformers 122. Thus, a single UDC circuit 140 may be associated with a plurality of beamformers 122 of the beamformer array 120 (e.g., there may be 48 beamformers 122 in the beamformer array 120, associated with 48 antenna elements 112 of the antenna array 110). This is schematically illustrated in FIG. 1 with a dashed line and a dotted line connecting various elements of the beamformer array 120 and the UDC circuit 140. Namely, FIG. 1 illustrates that the dashed line connects the downconverter circuit of the UDC circuit 140 (namely, the amplifier 142) to the RX paths of two different beamformers 122, and that the dotted line connects the upconverter circuit of the UDC circuit 140 (namely, the amplifier 146) to the TX paths of two different beamformers 122.

The mixer 144 in the downconverter path of the UDC circuit 140 may have [at least] two inputs and one output. The two inputs of the mixer 144 include an input from the amplifier 142, which may, e.g., be an LOw-noise amplifier (LNA), and an input from the phase shift module 150. The one output of the mixer 144 is an output to provide the downconverted signal 156, which may, e.g., be an IF signal 156. The mixer 144 may be configured to receive an RF RX signal from the RX path of one of the beamformers 122, after it has been amplified by the amplifier 142, at its' first input and receive a signal from the phase shift module 150 at its' second input, and mix these two signals to downconvert the RF RX signal to an LOwer frequency, producing the downconverted RX signal 156, e.g., the RX signal at the IF. Thus, the mixer 144 in the downconverter path of the UDC circuit 140 may be referred to as a "downconverting mixer."

The mixer 148 in the upconverter path of the UDC circuit 140 may have [at least] two inputs and one output. The two inputs of the mixer 148 include an input from the phase shift module 150 and a TX signal 158 of an LOwer frequency, e.g., the TX signal at IF. The one output of the mixer 148 is an output to the amplifier 146, which may, e.g., be a power amplifier (PA). The mixer 148 may be configured to receive an IF TX signal 158 (i.e., the lower frequency, e.g. IF, signal to be transmitted) at its' first input and receive a signal from the phase shift module 150 at its' second input, and mix these two signals to upconvert the IF TX signal to the desired RF frequency, producing the upconverted RF TX signal to be provided, after it has been amplified by the amplifier 146, to the TX path of one of the beamformers 122. Thus, the mixer 148 in the upconverter path of the UDC circuit 140 may be referred to as a "upconverting mixer."

As is known in communications and electronic engineering, an IF is a frequency to which a carrier wave is shifted as an intermediate step in transmission or reception. The IF signal is created by mixing the carrier signal with an LO signal in a process called heterodyning, resulting in a signal at the difference or beat frequency. Conversion to IF may be useful for several reasons. One reason is that, when several stages of filters are used, they can all be set to a fixed frequency, which makes them easier to build and to tune. Another reason is that lower frequency transistors generally have higher gains so fewer stages may be required. Yet another reason is to improve frequency selectivity because it may be easier to make sharply selective filters at lower fixed frequencies.

It should also be noted that, while some descriptions provided herein refer to signals 156 and 158 as IF signals, these descriptions are equally applicable to embodiments where signals 156 and 158 are baseband signals. In such embodiments, frequency mixing of the mixers 144 and 148 may be a zero-IF mixing (also referred to as a "zero-IF conversion") in which an LO signal used to perform the mixing (in this setting, this may be the phase-shifted LO signal generated by the phase shift module 150) may have a center frequency in the band of RF RX/TX frequencies.

If the UDC circuit 140 was a conventional UDC circuit, then each of the mixers 144, 148, would receive LO signal 160 at one of their two inputs for frequency mixing as described above. In stark contrast to such a conventional implementation, the UDC circuit 140 includes the phase shift module 150 in the LO path, configured to provide a desired phase shift to the LO signal 160, before providing the LO signal to the mixers 144, 148. Thus, instead of receiving the LO signal 160 (as may be generated by the LO) at one of their inputs, each of the mixers 144, 148 receives a phase-shifted version of the LO signal 160. Moving the phase shifting operation to the LO path (e.g., between the LO signal generator and the mixers 144, 148), out of the signal path (e.g., between the digital circuitry that handles the signals 156, 158 and antenna elements 112, and in the wireless domain past the antenna elements 112) may advantageously reduce negative impact of phase shifting on the signal quality.

Although not specifically shown in FIG. 1, in further embodiments, the UDC circuit 140 may further include a balancer, e.g., in each of the TX and RX paths, configured to mitigate imbalances in the in-phase and quadrature (IQ) signals due to mismatching.

Furthermore, although also not specifically shown in FIG. 1, in other embodiments, the antenna apparatus 100 may include further instances of a combination of the antenna array 110, the beamformer array 120, and the UDC circuit 140 as described herein. In some such embodiments, the phase shift module 150 in each of such multiple UDC circuits 140 may be used to perform phase synchronization/matching between different UDC circuits 140 of the antenna apparatus 100.

The antenna apparatus 100 can steer an electromagnetic radiation pattern of the antenna array 110 in a particular direction, thereby enabling the antenna array 110 to generate a main beam in that direction and side lobes in other directions. The main beam of the radiation pattern is generated based on constructive inference of the transmitted RF signals based on the transmitted signals' phases. The side lobe levels may be determined by the amplitudes of the RF signals transmitted by the antenna elements. The antenna apparatus 100 can generate desired antenna patterns by providing phase shifter settings for the antenna elements 112, e.g., using the phase shift module 150, possibly in combination with the phase shifters of the beamformers 122.

It is possible that, over time, the amplitudes of signals and the relative phases among the antenna elements 112 can drift from the values set when the antenna apparatus 100 was originally calibrated. The drift can cause the antenna pattern to degrade, which can, for example, reduce the gain in a main lobe. In such situations, calibration may be used to accurately measure and control the phase and amplitude of the antenna elements 112 even after the antenna apparatus 100 has been deployed in the field. To that end, in some embodiments, calibration may be performed using relative measurements of phase and/or absolute measurements of amplitude, e.g., as described in U.S. patent application Ser. No. 15/904,045 or in U.S. patent application Ser. No. 16/246,917. In such embodiments, one or more probes (not shown in FIG. 1) may be placed between the antenna elements 112, and the phase and/or amplitude of the antenna elements may be measured. Then, the phase or amplitude can be assessed to determine adjustments that are made to the transmitter/receiver/transceiver connected to the antenna elements 112. In particular, the phase or amplitude can be assessed to determine phase shift that is to be introduced in the LO path using the phase shift module 150. In some embodiments, the antenna elements 112 may transmit signals, and the phase of one or more antenna elements 112 may be adjusted until a relatively high or maximum and/or relatively low or minimum power level is reached. Each of the one or more probe may include a radiative element configured to wirelessly transmit and/or receive RF signals (in other words, each of the probes may be implemented as an antenna element, provided in addition to the antenna elements 112 of the antenna array 110).

Phase Shift Module with an Enhanced Frequency Multiplier

Figure 2:
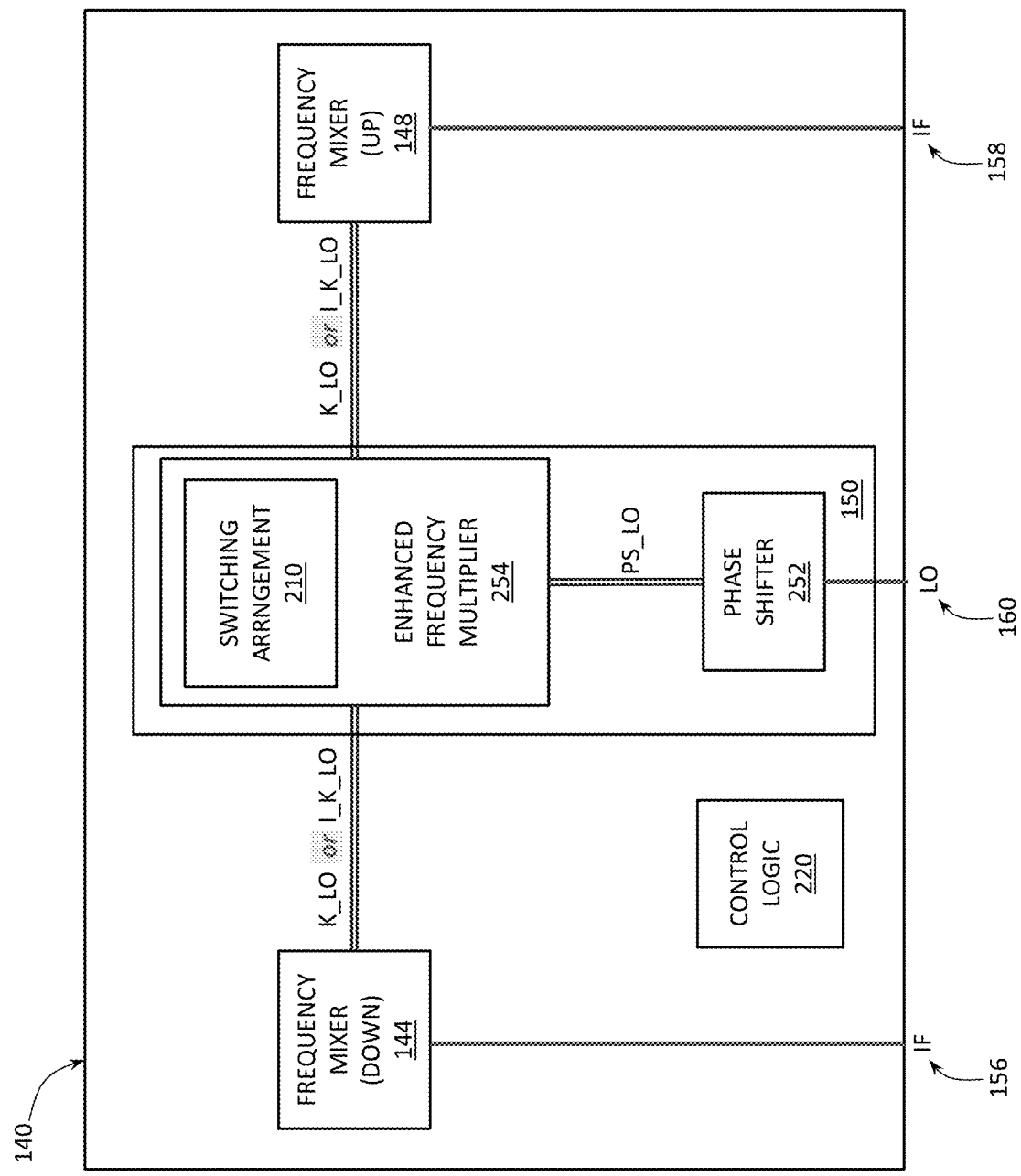
FIG. 2 provides a schematic illustration of a phase shift module with an enhanced frequency multiplier, according to some embodiments of the present disclosure.

In some embodiments, the phase shift module 150 may include a phase shifter 252 and an enhanced frequency multiplier 254, as shown in FIG. 2, providing a schematic illustration of the phase shift module 150 according to some embodiments of the present disclosure. In general, in such embodiments, the phase shift module 150 may be configured to apply both phase shift and frequency multiplication to the LO signal 160, and then provide such a frequency-multiplied and phase-shifted version of the LO Signal 160 to the mixers 144, 148. In particular, the phase shift module 150 may be configured to apply a desired phase shift to the LO signal 160 using the phase shifter 252, and multiply the phase-shifted LO signal by a factor K, which may be any number greater than 1, using the enhanced frequency multiplier 254. Such an approach may enable a relatively low-loss phase shifter because the maximum range of possible phase shifts may be smaller. The details of obtaining the frequency-multiplied and phase-shifted version of the LO signal 160 to use by up and down-mixers will now be described.

FIG. 2 provides a schematic illustration of further details of the phase shift module 150 shown in FIG. 1, according to some embodiments of the present disclosure. In particular, FIG. 2 illustrates blocks showing the UDC 140, the down-converting mixer 144, the upconverting mixer 148, the phase shift module 150, the IF RX signal 156, the IF TX signal 158, and the LO signal 160, as described with reference to FIG. 1 (which descriptions, therefore, are not repeated here). In addition, FIG. 2 presents notation of the different signals between various components (e.g., PS_LO, K_LO, etc.), which notation may then be used in explaining different embodiments of the enhanced frequency multiplier 254 with reference to FIGS. 4-6.

As shown in FIG. 2, the phase shifter 252 of the phase shift module 150 is configured to receive the LO signal 160, denoted as a signal LO. The phase shifter 252 is configured to add a phase shift PS to the signal LO so that, after frequency multiplication by the enhanced frequency multiplier 254, the output signal from the enhanced frequency multiplier 254 has the desired phase shift. In some embodiments, the phase shift added to the signal LO by the phase shifter 252 may be a phase shift to perform antenna calibration, e.g., using probe measurements as described above. In some embodiments, the amount of phase shift PS to be added by the phase shifter 252, as well as other operations described herein, in particular other operations related to operation of any components of the antenna apparatus 100 as described herein, may be enabled or controlled by a control logic 220. The control logic 220 is shown in FIG. 2 as being a part of the UDC circuit 140, but, in general, the control logic 220 may be implemented in any other manner, e.g., may be external to the UDC circuit 140 but included elsewhere in the antenna apparatus 100, or be implemented in a cloud, as long as the control logic 220 is communicatively coupled to the components of the antenna apparatus 100 that it is controlling.

As a result of adding the phase shift PS to the LO signal, the LO signal becomes phase-shifted by PS but still has the same frequency, $f_{LO}$, and is output from the phase shifter 252 as a phase-shifted signal PS_LO, as shown in FIG. 2.

The phase-shifted signal PS_LO is then provided to the enhanced frequency multiplier 254 of the phase shift module 150. A conventional frequency multiplier uses only the signal provided thereto as a base for generating a frequency-multiplied signal. In contrast, the enhanced frequency multiplier 254 is configured to generate, e.g., when instructed to do so by the control logic 220, an inverted version of the signal provided thereto, and generate a frequency-multiplied signal based on both, the original signal provided thereto and the inverted version of said signal. As used herein, unless specified otherwise, describing that an inverted version of a signal provided to the enhanced frequency multiplier 254 (i.e., the signal PS_LO) is generated covers both, an inverted version of the signal PS_LO itself, as well as an inverted version of the signal PS_LO that has undergone some other transformation, e.g., an inverted version of a signal that is generated after the signal PS_LO is processed by a transconductance amplifier. As used in the art, inversion of a signal may be seen as adding a phase shift of 180 degrees to the signal.

Figures 4A, 4B:
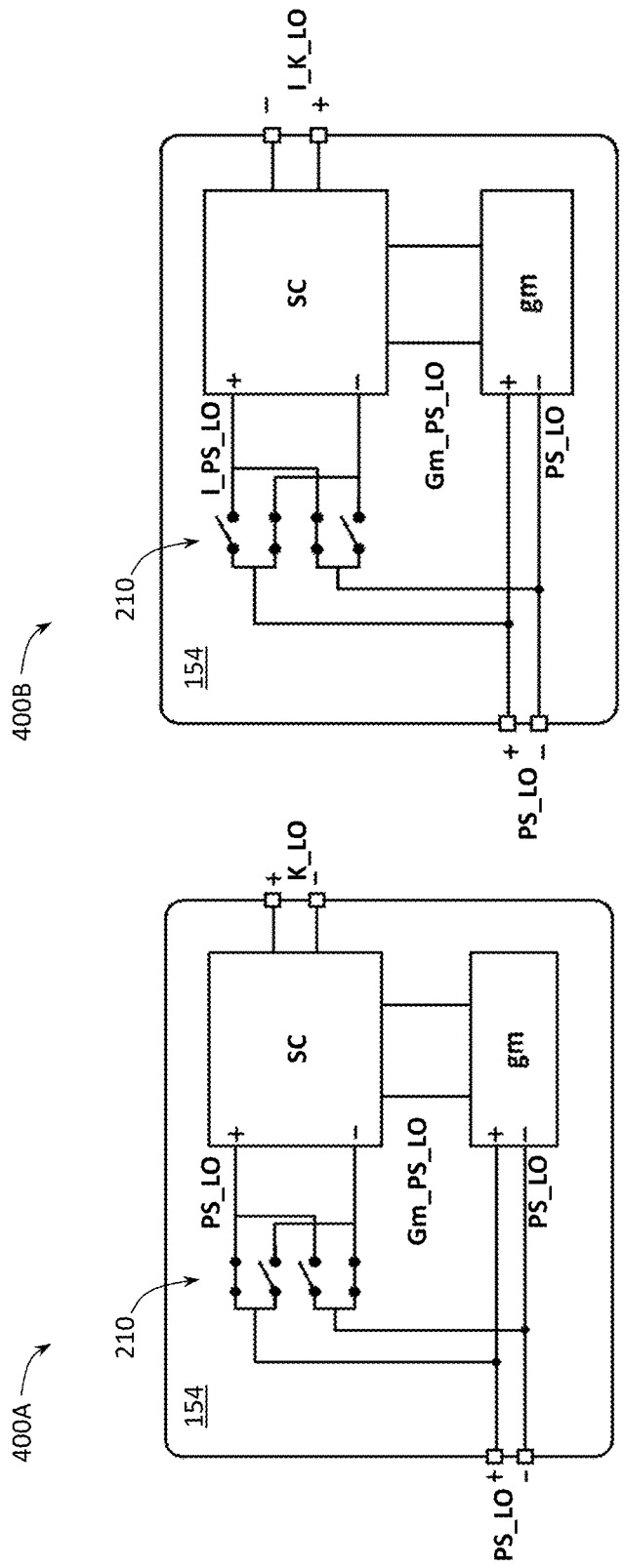
FIGS. 4A and 4B provide schematic illustrations of different states of a switching arrangement of an enhanced frequency multiplier configured to invert signals provided to a switching core of the multiplier from an input to the multiplier, according to some embodiments of the present disclosure.
Figures 5A, 5B:
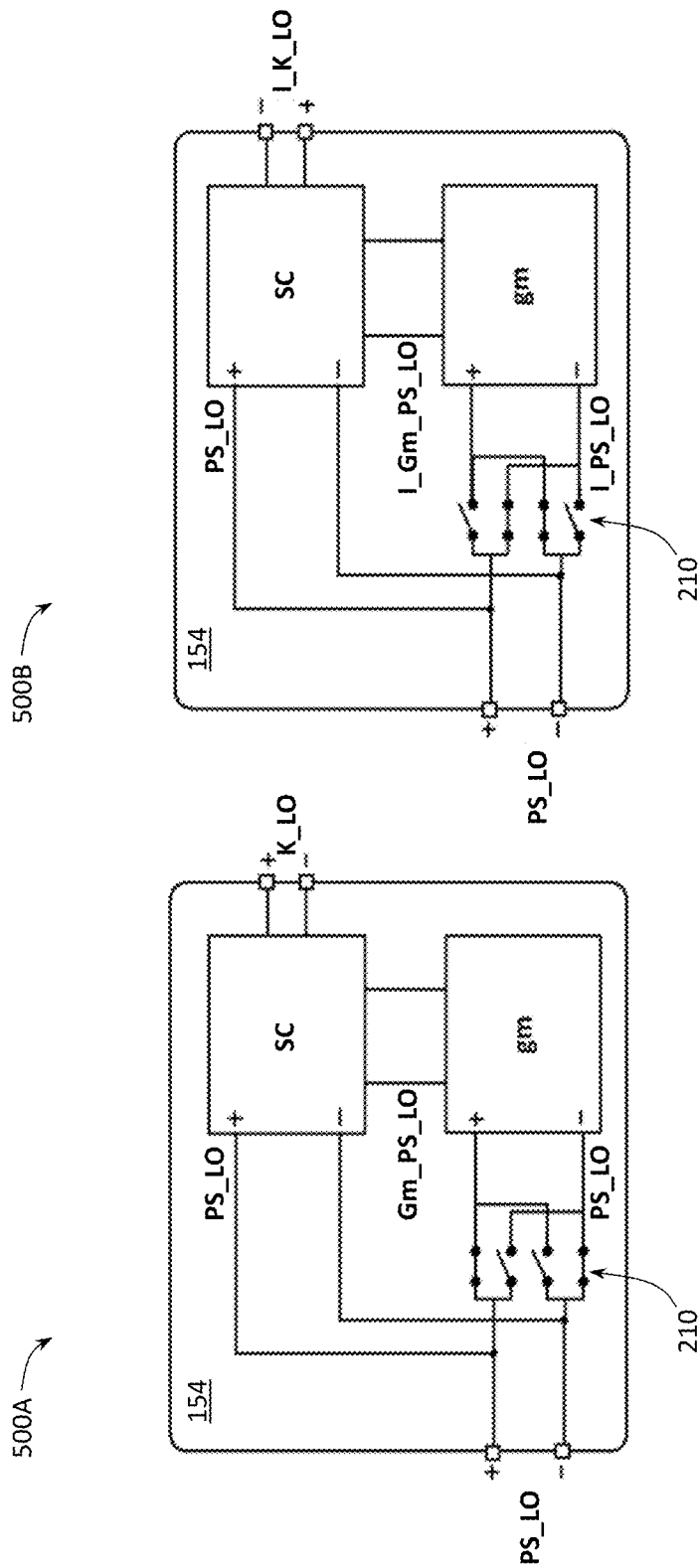
FIGS. 5A and 5B provide schematic illustrations of different states of a switching arrangement of an enhanced frequency multiplier configured to invert signals provided to a transconductance amplifier of the multiplier from an input to the multiplier, according to some embodiments of the present disclosure.
Figures 6A, 6B:
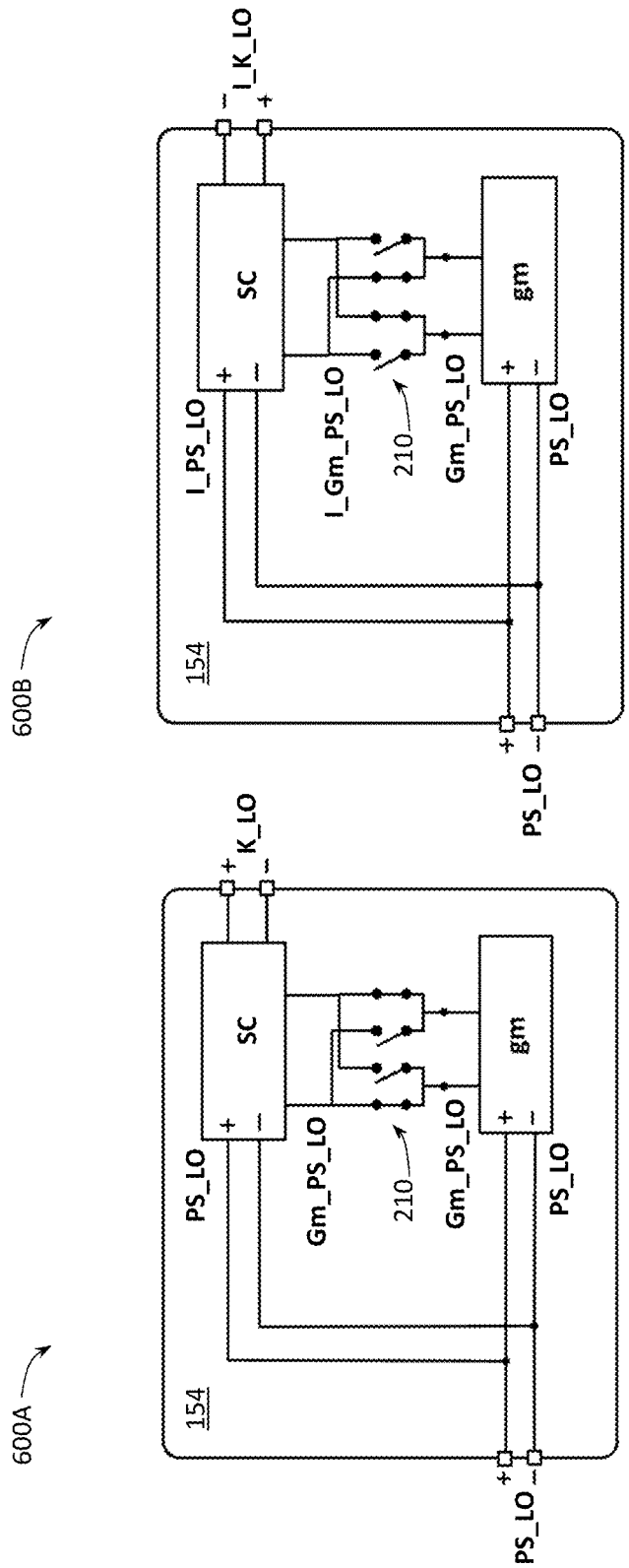
FIGS. 6A and 6B provide schematic illustrations of different states of a switching arrangement of an enhanced frequency multiplier configured to invert signals provided to a switching core of the multiplier from a transconductance amplifier of the multiplier, according to some embodiments of the present disclosure.

In some implementations, a frequency multiplier may be implemented as a Gilbert cell frequency multiplier that includes a switching core and a transconductance amplifier, where the input signal to the cell is provided to the switching core and to the transconductance amplifier, and the switching core generates a frequency-multiplied signal of the input signal based on the input signal and an output of the transconductance amplifier. In some embodiments where the enhanced frequency multiplier 254 is a Gilbert cell frequency multiplier, signal inversion of the input signal PS_LO may be performed before the signal PS_LO is provided to the switching core (as shown in FIG. 4B and described in greater detail below). In such embodiments, instead of providing the signal PS_LO to the switching core of the enhanced frequency multiplier 254, an inverted version of the signal PS_LO, which may be denoted as a signal I_PS_LO, is provided. In other embodiments where the enhanced frequency multiplier 254 is a Gilbert cell frequency multiplier, signal inversion of the input signal PS_LO may be performed before the signal PS_LO is provided to the transconductance amplifier (as shown in FIG. 5B and described in greater detail below). In such embodiments, instead of providing the signal PS_LO to the transconductance amplifier of the enhanced frequency multiplier 254, an inverted version of the signal PS_LO, i.e., the signal I_PS_LO, is provided. Still in other embodiments where the enhanced frequency multiplier 254 is a Gilbert cell frequency multiplier, signal inversion of the input signal PS_LO may be performed or after the transconductance amplifier generated an output signal Gm_PS_LO based on the signal PS_LO and before said output signal from the transconductance amplifier is provided to the switching core (as shown in FIG. 6B and described in greater detail below). In such embodiments, instead of providing the signal Gm_PS_LO, generated by the transconductance amplifier of the enhanced frequency multiplier 254, an inverted version of the signal Gm_PS_LO, which may be denoted as a signal I_Gm_PS_LO, is provided to the switching core.

The enhanced frequency multiplier 254 may then use the signal PS_LO to generate a frequency-multiplied signal. In particular, at some points in time, the enhanced frequency multiplier 254 may use only the signal PS_LO but not any inverted version of that signal to generate a frequency-multiplied signal which may be denoted as K_LO. The signal K_LO is a frequency-multiplied signal having a frequency $f_{K\_LO}$ that is a multiple K of the frequency $f_{LO}$ of the LO signal, i.e., $f_{K\_LO}=K \times f_{LO}$. As a result of such frequency multiplication without using any inverted version of the signal PS_LO, the signal K_LO is phase-shifted by a phase shift K×PS with respect to the signal LO, effectively increasing the phase shift provided by the phase shifter 252 by a factor K. Furthermore, at other points in time, the enhanced frequency multiplier 254 may use the signal PS_LO and an inverted version of that signal, e.g., either the signal I_PS_LO or the signal I_Gm_PS_LO, to generate a frequency-multiplied signal which may be denoted as I_K_LO. Similar to the signal K_LO, the signal I_K_LO is a frequency-multiplied signal having a frequency $f_{I\_K\_LO}$ that is a multiple K of the frequency $f_{LO}$ of the LO signal, i.e., $f_{I\_K\_LO}=K \times f_{LO}$. However, as a result of frequency multiplication that uses any inverted version of the signal PS_LO (e.g., either the signal I_PS_LO or the signal I_Gm_PS_LO), the signal I_K_LO is phase-shifted by a phase shift −K×PS with respect to the signal LO, effectively increasing the phase shift provided by the phase shifter 252 by a factor K but in the direction opposite to that of the signal K_LO (i.e., the sign of the phase shift of the signal I_K_LO is opposite to that of K_LO, or, phrased differently, the signals K_LO and I_K_LO are 180 degrees out of phase).

In this manner, by configuring the enhanced frequency multiplier 254 to either use only the signal PS_LO without using any inverted version of that signal, or use the signal PS_LO together with an inverted version of that signal, frequency-multiplied signals K_LO or I_K_LO, respectively, may be generated. Since the signals K_LO and I_K_LO have phase shifts of, respectively, either K×PS or −K×PS, the phase shift range that could be realized by the enhanced frequency multiplier 254 is effectively doubled compared to that of a conventional frequency multiplier. Namely, the phase shift that may be realized by a conventional frequency multiplier is K×PS, while the phase shift that may be realized by enhanced frequency multiplier 254 is 2×K×PS.

For example, consider that the phase shifter 252 is a 90 degree phase shifter, i.e., a phase shifter that may add a phase shift PS in a range of maximum 90 degrees, e.g., the phase shift may be between 0 and maximum 90 degrees. Further consider that the factor K for the frequency multiplication is 2, i.e., the enhanced frequency multiplier 254 is a frequency doubler. In such an example, the enhanced frequency multiplier 254 may either generate the signal K_LO with the maximum phase shift of up to 180 degrees (2×90 degrees), or generate the signal I_K_LO with the maximum phase shift of up to −180 degrees (2×90 degrees), thus realizing a full range of 360 degrees of possible phase shifts using only a 90 degree phase shifter. Such advantageous realization of a large range of possible phase shifts is not to be underestimated as reducing the demand on the maximum phase shift that a phase shifter should be able to provide may allow significantly reduce losses associated with the phase shifter.

In another example, consider that the phase shifter 252 is a 45 degree phase shifter, i.e., a phase shifter that may add a phase shift PS in a range of maximum 45 degrees, e.g., the phase shift may be between 0 and maximum 45 degrees. Further consider that the factor K for the frequency multiplication is 4, i.e., the enhanced frequency multiplier 254 is a frequency quadrupler. In such an example, the enhanced frequency multiplier 254 may either generate the signal K_LO with the maximum phase shift of up to 180 degrees (4×45 degrees), or generate the signal I_K_LO with the maximum phase shift of up to −180 degrees (−4×45 degrees), thus realizing a full range of 360 degrees of possible phase shifts using only a 45 degree phase shifter.

In some embodiments, whether the enhanced frequency multiplier 254 uses only the signal PS_LO without using any inverted version of that signal or uses the signal PS_LO together with an inverted version of that signal may be controlled by the control logic 220. When the enhanced frequency multiplier 254 generates the output signal K_LO, it may be described as operating in its' first mode of operation, while, when the enhanced frequency multiplier 254 generates the output signal I_K_LO, it may be described as operating in its' second mode of operation (in some embodiments, the enhanced frequency multiplier 254 may operate in one of more than the first and second modes). The control logic 220 may be used to control whether the enhanced frequency multiplier 254 operates in the first or second mode. For example, the control logic 220 may be configured to provide a control signal to the enhanced frequency multiplier 254 to configure the multiplier 254 to operate in its' first or its' second mode. For example, at some points in time, the control logic 220 may provide a first control signal, indicating that the enhanced frequency multiplier 254 is to use only the signal PS_LO without using any inverted version of that signal to perform frequency multiplication, thus generating the output signal K_LO; at other points in time, the control logic 220 may provide a second control signal, indicating that the enhanced frequency multiplier 254 is to use both the signal PS_LO and an inverted version of that signal to perform frequency multiplication, thus generating the output signal I_K_LO. The frequency-multiplied signal generated by the frequency multiplier 254 (i.e., either K_LO or I_K_LO as described herein) may then be provided to the mixers 144, 148, as illustrated in FIG. 2.

In some embodiments, the enhanced frequency multiplier 254 may include a switching arrangement 210, shown in FIG. 2, configured to either perform inversion of the signal PS_LO (e.g., when the enhanced frequency multiplier 254 operates in the second mode) or leave the signal PS_LO uninverted (e.g., when the enhanced frequency multiplier 254 operates in the first mode). Such embodiments may be particularly advantageous when the signal PS_LO is a differential signal because inversion of a differential signal may be performed by simply swapping the polarity of the two lines of the signal. FIG. 2 schematically illustrates such embodiments by showing signals that are input to, and output from, the enhanced frequency multiplier 254 with double lines, suggesting that these signals may be differential signals. However, other embodiments of the present disclosure do not have to use differential signals as shown and described herein.

In general, as used herein, the terms "switch" or "switching circuit" or "switching arrangement" (e.g., the switching arrangement 210) may include any suitable switching arrangement (e.g., any suitable combination of switches) that allows ensuring that the switching functionality as described is performed. Some example embodiments of the switching arrangement 210 are illustrated in FIGS. 4-6, described below.

Operating a Phase Shift Module with an Enhanced Frequency Multiplier

Figure 3:
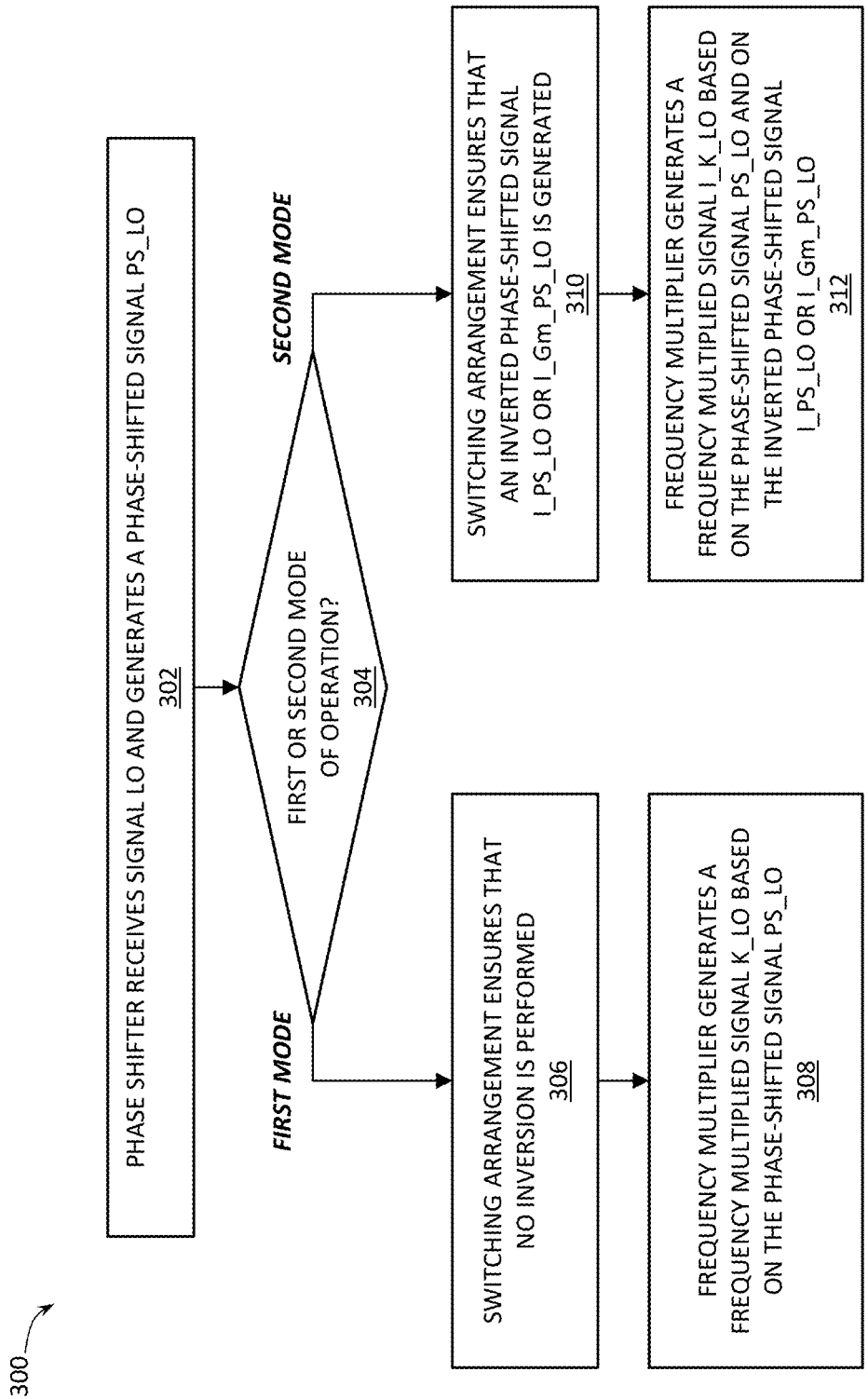
FIG. 3 provides a block diagram illustrating a method for realizing a phase shift using a phase shift module with an enhanced frequency multiplier, according to some embodiments of the present disclosure.

FIG. 3 provides a block diagram illustrating a method 300 for realizing a phase shift using a phase shift module with an enhanced frequency multiplier, e.g., the phase shift module 150 with the enhanced frequency multiplier 254 as described herein, according to some embodiments of the present disclosure. Although operations of the method 300 are described with reference to the system components shown in FIG. 2, in general, any system configured to perform these operations, in any order, is within the scope of the present disclosure. In some embodiments, the control logic 220 may be configured to control the operations of the method 300.

The method 300 may begin, at 302, with the phase shifter 252 receiving the LO signal and generating the phase-shifted signal PS_LO. The phase-shifted signal PS_LO may then be provided to the enhanced frequency multiplier 254, e.g., to the switching arrangement 210 of the enhanced frequency multiplier 254.

At 304, it is determined whether the enhanced frequency multiplier 254 is to operate in the first or in the second mode of operation. For example, the control logic 220 may be configured to determine that, e.g., based to which phase shift is to be produced by the enhanced frequency multiplier 254, and provide a control signal indicative of either the first or the second mode of operation.

If it was determined at 304 that the enhanced frequency multiplier 254 is to operate in the first mode, then from 304 the method may proceed to 306, where the switching arrangement 210 is in a state where inversion of the signal PS_LO is not performed. With the switching arrangement 210 in such a state, the enhanced frequency multiplier 254 may then generate, at 308, the frequency-multiplied signal K_LO as described above.

On the other hand, if it was determined at 304 that the enhanced frequency multiplier 254 is to operate in the second mode, then from 304 the method may proceed to 310, where the switching arrangement 210 is in a state where inversion of the signal PS_LO is performed, i.e., where either an inverted signal I_PS_LO or an inverted signal I_Gm_PS_LO is generated. With the switching arrangement 210 in such a state, the enhanced frequency multiplier 254 may then generate, at 312, the frequency-multiplied signal I_K_LO as described above.

Example Switching Arrangements of an Enhanced Frequency Multiplier

As described above, in some embodiments, the enhanced frequency multiplier 254 may include the switching arrangement 210, schematically illustrated in FIG. 2, configured to either perform inversion of the signal PS_LO (e.g., when the enhanced frequency multiplier 254 operates in the second mode) or leave the signal PS_LO uninverted (e.g., when the enhanced frequency multiplier 254 operates in the first mode). Some example embodiments of the switching arrangement 210 are illustrated in FIGS. 4-6. In particular, FIGS. 4A, 5A, and 6A illustrate different embodiments of the switching arrangement 210 that controls the enhanced frequency multiplier 254 to operate in the first mode of operation described herein, while FIGS. 4B, 5B, and 6B illustrate different embodiments of the switching arrangement 210 that controls the enhanced frequency multiplier 254 to operate in the second mode of operation described herein.

Turning to the embodiments of FIG. 4 (i.e., FIGS. 4A and 4B together), each of FIGS. 4A and 4B illustrates the enhanced frequency multiplier 254 with an input shown at the bottom of the left side and an output shown at the top of the right side of the figure. Signals between various components of FIGS. 4A and 4B are shown with two lines, indicating that, in some embodiments, all of these may be differential signals. Each of FIGS. 4A and 4B illustrates an embodiment where the enhanced frequency multiplier 254 is implemented as a Gilbert cell multiplier having a switching core (shown in FIGS. 4A and 4B as "SC") and a transconductance amplifier (shown in FIGS. 4A and 4B as "gm"), and with the switching arrangement 210 provided between the input to the enhanced frequency multiplier 254 and the switching core SC.

In such an embodiment, when the enhanced frequency multiplier 254 operates in the first mode, the switching arrangement 210 may be in a configuration/state 400A as shown in FIG. 4A. Namely, the input signal provided to the enhanced frequency multiplier 254, i.e., the signal PS_LO shown at the input terminal on the bottom left side of FIG. 4A, is provided without inversion to the transconductance amplifier gm. As shown in FIG. 4A, the switching arrangement 210 is in such a state that the input signal PS_LO passes the switching arrangement 210 and is also provided to the switching core SC without inversion. Thus, in the embodiment of FIG. 4A, the switching core SC receives the signal PS_LO from the input terminal and further receives the signal Gm_PS_LO, which is an output generated by the transconductance amplifier gm based on the signal PS_LO provided thereto. The switching core SC may then mix the two input signals provided thereto, namely, the signals PS_LO and Gm_PS_LO, to generate the frequency-multiplied signal K_LO which may then be provided at the output of the enhanced frequency multiplier 254, shown at the output terminal on the top right side of FIG. 4A.

Alternatively, the enhanced frequency multiplier 254 with the switching arrangement 210 provided between the input to the enhanced frequency multiplier 254 and the switching core may operate in the second mode, in which case the switching arrangement 210 may be in a configuration/state 400B as shown in FIG. 4B. In the second mode, the input signal provided to the enhanced frequency multiplier 254, i.e., the signal PS_LO shown at the input terminal on the bottom left side of FIG. 4B, is still provided without inversion to the transconductance amplifier gm, similar to FIG. 4A. However, different from FIG. 4A, as shown in FIG. 4B, the switching arrangement 210 is now in such a state that the switching arrangement 210 inverts the input signal PS_LO that passes through it, so that the switching arrangement provides to the switching core SC the inverted signal I_PS_LO. Thus, in the embodiment of FIG. 4B, the switching core SC receives the inverted signal I_PS_LO from the input terminal (inverted by the switching arrangement 210) and further receives the signal Gm_PS_LO, which is an output generated by the transconductance amplifier gm based on the signal PS_LO provided thereto. The switching core SC may then mix the two input signals provided thereto, namely, the signals I_PS_LO and Gm_PS_LO, to generate the frequency-multiplied signal I_K_LO which may then be provided at the output of the enhanced frequency multiplier 254, shown at the output terminal on the top right side of FIG. 4B. Comparison of the states 400A and 400B of the switching arrangement 210 shown in FIGS. 4A and 4B illustrates that, when the signal connection between the input terminal to the enhanced frequency multiplier 254 and the switching core SC is a differential connection, then inversion of the signal PS_LO may be achieved by the switching arrangement 210 simply reversing the polarity on each of the two differential lines of the differential signal connection (other signal connections of FIG. 4 may but do not have to be differential).

Turning to the embodiments of FIG. 5 (i.e., FIGS. 5A and 5B together), similar to FIG. 4, each of FIGS. 5A and 5B illustrates the enhanced frequency multiplier 254 with an input shown at the bottom of the left side and an output shown at the top of the right side of the figure, and signals between various components of FIGS. 5A and 5B are shown with two lines, indicating that, in some embodiments, all of these may be differential signals. Also similar to FIG. 4, each of FIGS. 5A and 5B illustrates an embodiment where the enhanced frequency multiplier 254 is implemented as a Gilbert cell multiplier having a switching core (shown in FIGS. 5A and 5B as "Sc") and a transconductance amplifier (shown in FIGS. 5A and 5B as "gm"), but, different from FIG. 4, the switching arrangement 210 of FIG. 5 is provided between the input to the enhanced frequency multiplier 254 and the transconductance amplifier gm.

In such an embodiment, when the enhanced frequency multiplier 254 operates in the first mode, the switching arrangement 210 may be in a configuration/state 500A as shown in FIG. 5A. Namely, the input signal provided to the enhanced frequency multiplier 254, i.e., the signal PS_LO shown at the input terminal on the bottom left side of FIG. 5A, is provided without inversion to the switching core SC. As shown in FIG. 5A, the switching arrangement 210 is in such a state that the input signal PS_LO passes the switching arrangement 210 and is also provided to the transconductance amplifier gm without inversion. Thus, in the embodiment of FIG. 5A, the SC receives the signal PS_LO from the input terminal and further receives the signal Gm_PS_LO, which is an output generated by the transconductance amplifier gm based on the signal PS_LO provided thereto from the switching arrangement 210. The switching core SC may then mix the two input signals provided thereto, namely, the signals PS_LO and Gm_PS_LO, to generate the frequency-multiplied signal K_LO which may then be provided at the output of the enhanced frequency multiplier 254, shown at the output terminal on the top right side of FIG. 5A.

Alternatively, the enhanced frequency multiplier 254 with the switching arrangement 210 provided between the input to the enhanced frequency multiplier 254 and the transconductance amplifier gm may operate in the second mode, in which case the switching arrangement 210 may be in a configuration/state 500B as shown in FIG. 5B. In the second mode, the input signal provided to the enhanced frequency multiplier 254, i.e., the signal PS_LO shown at the input terminal on the bottom left side of FIG. 5B, is still provided without inversion to the switching core SC, similar to FIG. 5A. However, different from FIG. 5A, as shown in FIG. 5B, the switching arrangement 210 is now in such a state that the switching arrangement 210 inverts the input signal PS_LO that passes through it on the way to the transconductance amplifier gm, so that the switching arrangement provides to the transconductance amplifier gm the inverted signal I_PS_LO. Based on the input signal I_PS_LO, the transconductance amplifier gm then generates an output signal I_Gm_PS_LO. Thus, in the embodiment of FIG. 5B, the switching core SC receives the signal PS_LO from the input terminal and further receives the signal I_Gm_PS_LO, which is an output generated by the transconductance amplifier gm based on the signal I_PS_LO provided thereto, which was inverted by the switching arrangement 210. The switching core SC may then mix the two input signals provided thereto, namely, the signals PS_LO and I_Gm_PS_LO, to generate the frequency-multiplied signal I_K_LO which may then be provided at the output of the enhanced frequency multiplier 254, shown at the output terminal on the top right side of FIG. 5B. Comparison of the states 500A and 500B of the switching arrangement 210 shown in FIGS. 5A and 5B illustrates that, when the signal connection between the input terminal to the enhanced frequency multiplier 254 and the transconductance amplifier gm is a differential connection, then inversion of the signal PS_LO may be achieved by the switching arrangement 210 simply reversing the polarity on each of the two differential lines of that differential signal connection (other signal connections of FIG. 5 may but do not have to be differential)
.

Turning to the embodiments of FIG. 6 (i.e., FIGS. 6A and 6B together), similar to FIGS. 4 and 5, each of FIGS. 6A and 6B illustrates the enhanced frequency multiplier 254 with an input shown at the bottom of the left side and an output shown at the top of the right side of the figure, and signals between various components of FIGS. 6A and 6B are shown with two lines, indicating that, in some embodiments, all of these may be differential signals. Also similar to FIGS. 4 and 5, each of FIGS. 6A and 6B illustrates an embodiment where the enhanced frequency multiplier 254 is implemented as a Gilbert cell multiplier having a switching core (shown in FIGS. 6A and 6B as "SC") and a transconductance amplifier (shown in FIGS. 6A and 6B as "gm"), but, different from FIGS. 4 and 5, the switching arrangement 210 of FIG. 6 is provided between the transconductance amplifier gm and the switching core SC.

In such an embodiment, when the enhanced frequency multiplier 254 operates in the first mode, the switching arrangement 210 may be in a configuration/state 600A as shown in FIG. 6A. Namely, the input signal provided to the enhanced frequency multiplier 254, i.e., the signal PS_LO shown at the input terminal on the bottom left side of FIG. 6A, is provided without inversion to each of the switching core SC and the transconductance amplifier gm. As shown in FIG. 6A, the transconductance amplifier gm then generates an output Gm_PS_LO, based on the input signal PS_LO provided thereto. As further shown in FIG. 6A, the switching arrangement 210 is in such a state that the output signal Gm_PS_LO generated by the transconductance amplifier gm passes the switching arrangement 210 and is provided to the switching core SC without inversion. Thus, in the embodiment of FIG. 6A, the SC receives the signal PS_LO from the input terminal and further receives the signal Gm_PS_LO from the switching arrangement 210, which is the output generated by the transconductance amplifier gm based on the signal PS_LO provided thereto from the input terminal of the enhanced frequency multiplier 254. The switching core SC may then mix the two input signals provided thereto, namely, the signals PS_LO and Gm_PS_LO, to generate the frequency-multiplied signal K_LO which may then be provided at the output of the enhanced frequency multiplier 254, shown at the output terminal on the top right side of FIG. 6A.

Alternatively, the enhanced frequency multiplier 254 with the switching arrangement 210 provided between the transconductance amplifier gm and the switching core SC may operate in the second mode, in which case the switching arrangement 210 may be in a configuration/state 600B as shown in FIG. 6B. In the second mode, the input signal provided to the enhanced frequency multiplier 254, i.e., the signal PS_LO shown at the input terminal on the bottom left side of FIG. 6B, is still provided as such to each of the switching core SC and the transconductance amplifier gm, similar to FIG. 6A. Also similar to FIG. 6A, the transconductance amplifier gm still generates the output Gm_PS_LO based on the input signal PS_LO provided thereto, as shown in FIG. 6B. However, different from FIG. 6A, as shown in FIG. 6B, the switching arrangement 210 is now in such a state that the switching arrangement 210 inverts the output signal Gm_PS_LO generated by the transconductance amplifier gm, so that the switching arrangement 210 provides to the switching core SC the inverted version of the output from the transconductance amplifier gm, namely, the signal I_Gm_PS_LO. Thus, in the embodiment of FIG. 6B, the switching core SC receives the signal PS_LO from the input terminal and further receives the signal I_Gm_PS_LO, which is an inverted version (inverted by the switching arrangement 210) of the output signal generated by the transconductance amplifier gm based on the signal PS_LO provided thereto. The switching core SC may then mix the two input signals provided thereto, namely, the signals PS_LO and I_Gm_PS_LO, to generate the frequency-multiplied signal I_K_LO which may then be provided at the output of the enhanced frequency multiplier 254, shown at the output terminal on the top right side of FIG. 6B. Comparison of the states 600A and 600B of the switching arrangement 210 shown in FIGS. 6A and 6B illustrates that, when the signal connection between the transconductance amplifier gm and the switching core SC of the enhanced frequency multiplier 254 is a differential connection, then inversion of the signal Gm_PS_LO (which is a signal based on the signal PS_LO) may be achieved by the switching arrangement 210 simply reversing the polarity on each of the two differential lines of that differential signal connection (other signal connections of FIG. 6 may but do not have to be differential).

Phase Shift Module with Temperature Compensation in LO Path

Figure 7:
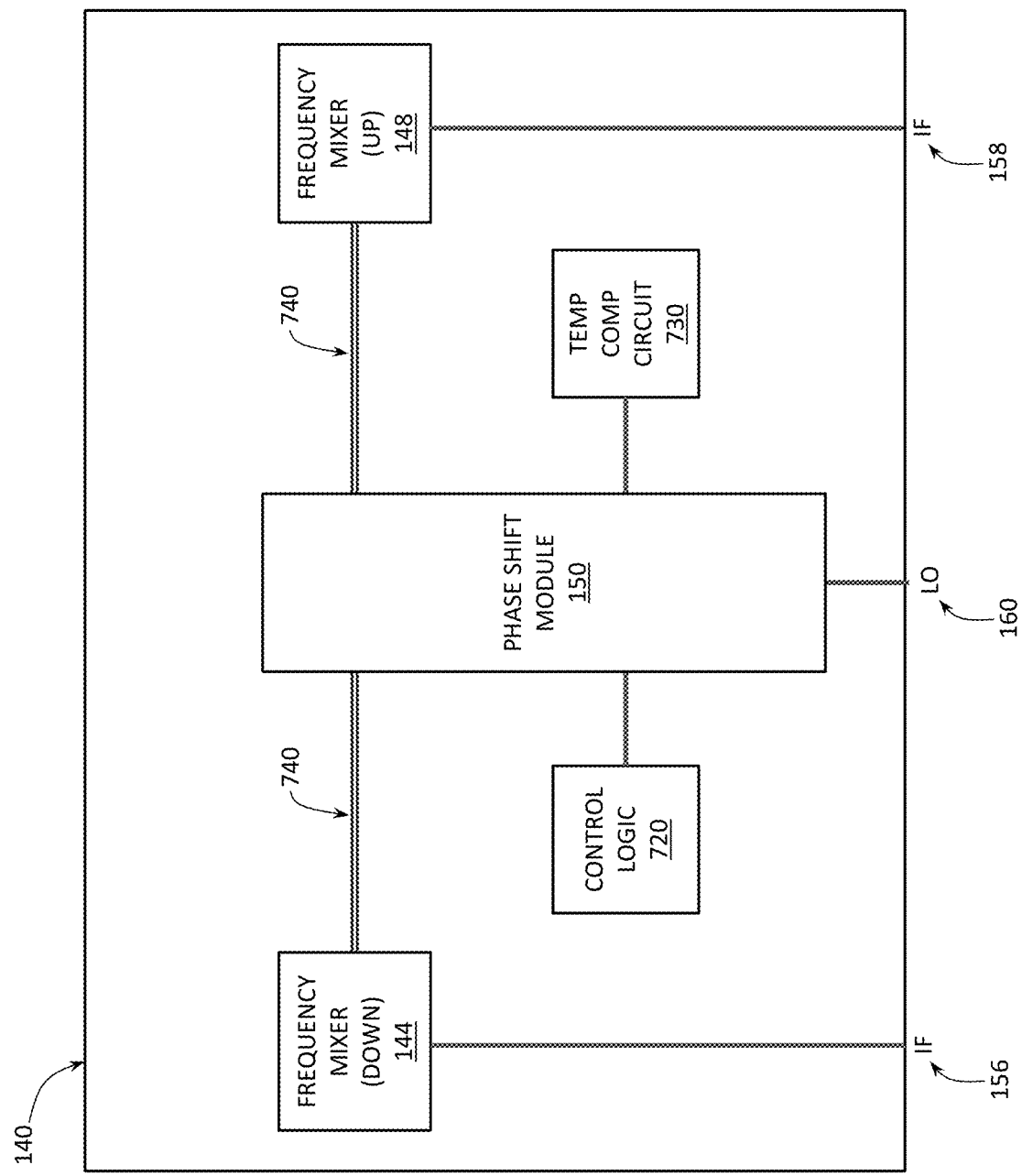
FIG. 7 provides a schematic illustration of a phase shift module with temperature compensation, according to some embodiments of the present disclosure.

In some embodiments, the phase shift module 150 provided in the LO path may further be configured to implement temperature compensation to reduce or minimize temperature variations of a phase shift across temperatures. FIG. 7 provides a schematic illustration of further details of the phase shift module 150 shown in FIG. 1, now configured to implement temperature compensation, according to some embodiments of the present disclosure. In particular, FIG. 7 illustrates blocks showing the UDC 140, the downconverting mixer 144, the upconverting mixer 148, the phase shift module 150, the IF RX signal 156, the IF TX signal 158, and the LO signal 160, as described with reference to FIG. 1 (which descriptions, therefore, are not repeated here). In addition, FIG. 7 further illustrates a control logic 720 and a temperature compensation circuit 730.

It should be noted that, in some embodiments, the phase shift module 150 of the UDC circuit 140 shown in FIG. 7 may be the phase shift module 150 with the enhanced frequency multiplier as described above, e.g., as described with reference to FIGS. 2-6. However, in other embodiments, the phase shift module 150 of the UDC circuit 140 of FIG. 7 may be any other module configured to realize desired phase shifts.

The control logic 720 may be similar to the control logic 220, descriptions of which, therefore, are not repeated here. The control logic 720 may be configured to control at least some of operations of temperature compensation described herein.

The temperature compensation circuit 730 may be configured to determine a temperature compensation to be applied to a phase shift to be applied by the phase shift module 150 and the phase shift module 150 may be configured to apply the phase shift to the LO signal 160 to generate a phase-shifted LO signal 740, the phase shift based on the temperature compensation determined by the temperature compensation circuit 730 and the target (i.e., desired) phase shift to be applied. As shown in FIG. 7, the phase-shifted LO signal 740 may then be provided to the frequency mixers 144, 148, so that the mixers can perform frequency mixing using the phase-shifted LO signal 740.

As used herein, "temperature compensation" refers to the amount indicative of phase shift (which may be either positive or negative) to be applied to the LO signal 160 in addition to the desired phase shift, to realize the desired phase shift in the LO signal 160, where additional phase shift is intended to reduce or minimize how a phase shift actually realized in a real-life device may differ depending on the temperature of the device. For example, consider a scenario that the desired phase shift to be added to the LO signal 160 is 35 degrees. Further consider that it has been established (e.g., by measurements as described below), that, at the current operation temperature of the antenna apparatus, if a phase shift of 35 degrees is applied to the LO signal 160, the resulting phase shift actually realized will be 33 degrees. In such a case, the temperature compensation to be applied may be indicative of this 2 degrees difference (35−33=2), and the temperature compensation circuit 730 may indicate to the phase shift module 150 that in order to achieve the desired 35 degrees phase shift, the phase shift module 150 may need to apply a phase shift of about 37 degrees. For example, the temperature compensation circuit 730 may indicate to the phase shift module 150 to apply a 37.5 degrees because it has been established that, at the current operation temperature of the antenna apparatus, if a phase shift of 37.5 degrees is applied to the LO signal 160, the resulting phase shift actually realized will be 35 degrees.

In some embodiments, the temperature compensation circuit 730 may be configured to determine the temperature compensation based on a temperature signal indicative of a temperature of one or more of the phase shift module 150, the one or more frequency mixers 144, 148, and the plurality of antenna elements 112 of the antenna array. For example, in some embodiments, the antenna apparatus 100 may include a temperature sensor (not specifically shown in the present figures), configured to generate a signal indicative of the temperature, which signal may, e.g., be provided to the temperature compensation circuit 730. In other embodiments, the temperature sensor may be remote (i.e., not included in the antenna apparatus 100).

In some embodiments, in order for the temperature compensation circuit 730 to determine the temperature compensation to be applied, the temperature compensation circuit 730 may be provided with information indicative of how a phase shift may vary as a function of temperature. In some such embodiments, this information may be pre-determined and provided to the temperature compensation circuit 730, e.g., may be pre-programmed and/or stored in the memory of the temperature compensation circuit 730. However, in other embodiments, it may be desirable to generate such information once the antenna apparatus 100 has been deployed in the field, e.g., every time the antenna apparatus 100 is being turned on, periodically after certain time periods (e.g., every 15 minutes), or at some specific times (e.g., as triggered by the control logic 720, e.g., as triggered by a human operator of the antenna apparatus 100). In some such embodiments, the temperature compensation circuit 730 may be configured to carry out a method as shown in FIG. 8.

Figure 8:
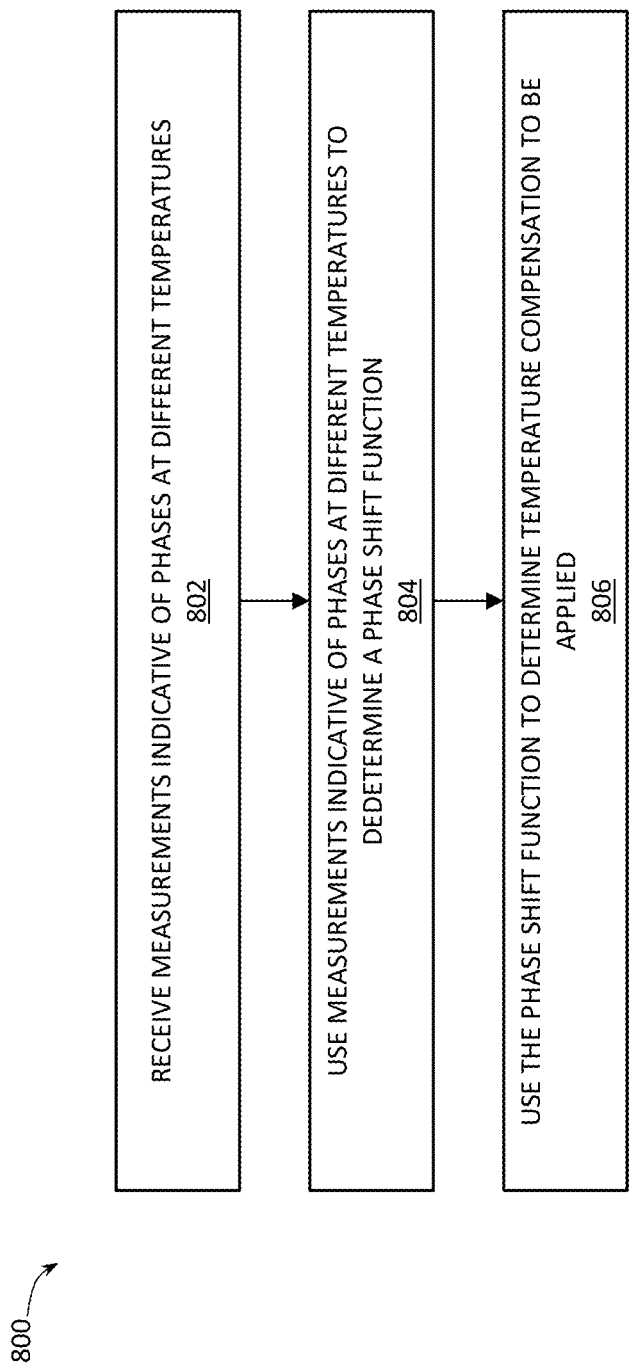
FIG. 8 provides a block diagram illustrating a method for realizing a temperature-compensated phase shift using a phase shift module with temperature compensation, according to some embodiments of the present disclosure.

FIG. 8 provides a block diagram illustrating a method 800 for realizing a temperature-compensated phase shift using the phase shift module 150 configured to implement temperature compensation, according to some embodiments of the present disclosure. Although operations of the method 800 are described with reference to the system components shown in FIG. 7, in general, any system configured to perform these operations, in any order, is within the scope of the present disclosure. In some embodiments, the control logic 220 may be configured to control the operations of the method 800.

Although not specifically shown in FIG. 8, the method 800 may begin with the temperature compensation circuit 730 selecting a temperature range over which calibration measurements to produce a function of how a phase shift depends on temperature are to be provided. As shown in FIG. 8, at 802, the method 800 may include the temperature compensation circuit 730 receiving said measurements performed at two or more different temperatures.

In one set of embodiments, the measurements received at 802 may be indicative of a phase of a TX signal at some point. For example, in some such embodiments, the measurements may be indicative of a phase of a TX signal at an output of the UDC circuit 140, e.g., at an output of the upconverting mixer 148. In other such embodiments, the measurements may be indicative of a phase of a TX signal transmitted by one or more antenna elements 112 of the antenna array 110. In still other such embodiments, the measurements may be indicative of a phase of a TX signal intercepted at any other point in the antenna apparatus 100.

In another set of embodiments, the measurements received at 802 may be indicative of a phase of a RX signal at some point. For example, in some such embodiments, the measurements may be indicative of a phase of a RX signal at an output of the UDC circuit 140, e.g., at an output of the downconverting mixer 144. In other such embodiments, the measurements may be indicative of a phase of a RX signal received by one or more antenna elements 112 of the antenna array 110 at an output of the one or more antenna elements 112. In still other such embodiments, the measurements may be indicative of a phase of a RX signal intercepted at any other point in the antenna apparatus 100.

In some embodiments, the measurements received at 802 may include measurements may include any combination of the example measurements described above.

In some embodiments, the measurements received at 802 may include measurements performed at only two different temperatures. In other embodiments, the measurements received at 802 may include measurements performed at more than two different temperatures. In various embodiments, the measurements received at 802 may include multiple measurements for a given temperature, e.g., so that the resulting values could be averaged. Receiving measurements at at least two different measurements would enable the temperature compensation circuit 730 to determine how phase shift may vary with temperature, but receiving measurements at more than two different temperatures may improve accuracy/resolution of the temperature compensation.

At 804, the temperature compensation circuit 730 may use the measurements received at 804 to determine a phase shift function, i.e., to determine a function indicative of phase shift variations depending on the temperature. In various embodiments, the phase shift function may be determined by, e.g., a linear interpolation, a polynomial, extrapolation, numerical curve-fitted function, and so on. For example, at 804, the temperature compensation circuit 730 may define the required phase shift slope across temperature.

Determining the function at 804 allows the temperature compensation circuit 730 to determine the temperature compensation to be applied to achieve the target phase shift, at 806, as shown in FIG. 8. For example, in some embodiments, the temperature compensation circuit 730 may be configured to determine the temperature compensation based on a temperature signal as described above.

Example Data Processing System

Figure 9:
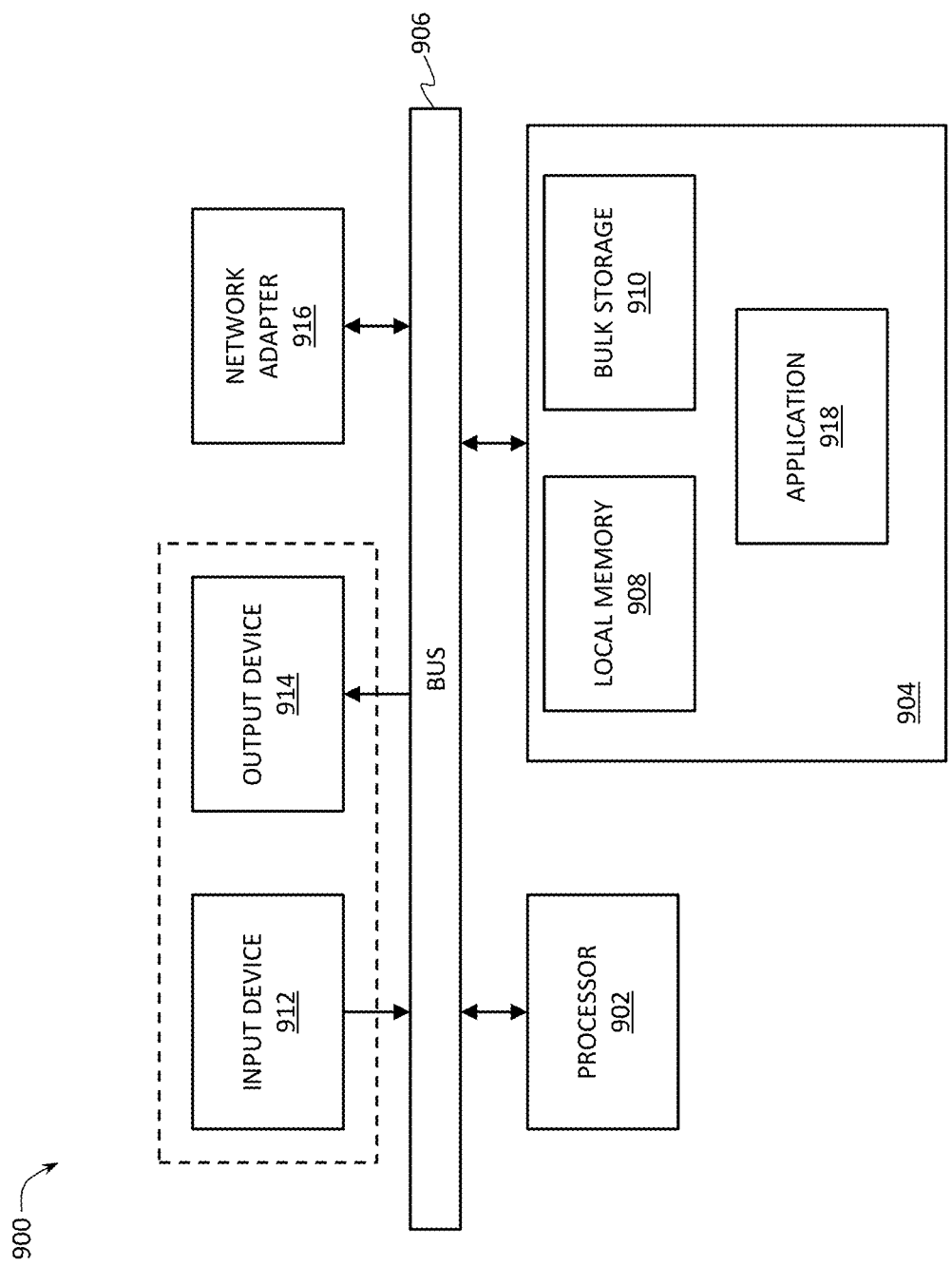
FIG. 9 provides a block diagram illustrating an example data processing system that may be configured to implement, or control, at least portions of realizing a phase shift module with an enhanced frequency multiplier and/or temperature compensation, according to some embodiments of the present disclosure.

FIG. 9 provides a block diagram illustrating an example data processing system 900 that may be configured to implement, or control implementations of, at least portions of a phase shift module with an enhanced frequency multiplier and/or temperature compensation as described herein, e.g., of the phase shift module 150 with the enhanced frequency multiplier 254 as described with reference to FIGS. 2-6 or the phase shift module 150 with the temperature compensation circuit 730 as described with reference to FIGS. 7-8, according to some embodiments of the present disclosure. For example, in some embodiments, any of the control logic 220, the control logic 720, or the temperature compensation circuit 730 may be implemented as the data processing system 900.

As shown in FIG. 9, the data processing system 900 may include at least one processor 902, e.g. a hardware processor 902, coupled to memory elements 904 through a system bus 906. As such, the data processing system may store program code within memory elements 904. Further, the processor 902 may execute the program code accessed from the memory elements 904 via a system bus 906. In one aspect, the data processing system may be implemented as a computer that is suitable for storing and/or executing program code. It should be appreciated, however, that the data processing system 900 may be implemented in the form of any system including a processor and a memory that is capable of performing the functions described within this disclosure.

In some embodiments, the processor 902 can execute software or an algorithm to perform the activities as discussed in this specification, in particular activities related to realizing a phase shift using a phase shift module with an enhanced frequency multiplier and/or with temperature compensation as described herein. The processor 902 may include any combination of hardware, software, or firmware providing programmable logic, including by way of non-limiting example a microprocessor, a digital signal processor (DSP), a field-programmable gate array (FPGA), a programmable logic array (PLA), an application specific integrated circuit (IC) (ASIC), or a virtual machine processor. The processor 902 may be communicatively coupled to the memory element 904, for example in a direct-memory access (DMA) configuration, so that the processor 902 may read from or write to the memory elements 904.

In general, the memory elements 904 may include any suitable volatile or non-volatile memory technology, including double data rate (DDR) random access memory (RAM), synchronous RAM (SRAM), dynamic RAM (DRAM), flash, read-only memory (ROM), optical media, virtual memory regions, magnetic or tape memory, or any other suitable technology. Unless specified otherwise, any of the memory elements discussed herein should be construed as being encompassed within the broad term "memory." The information being measured, processed, tracked or sent to or from any of the components of the data processing system 900 could be provided in any database, register, control list, cache, or storage structure, all of which can be referenced at any suitable timeframe. Any such storage options may be included within the broad term "memory" as used herein. Similarly, any of the potential processing elements, modules, and machines described herein should be construed as being encompassed within the broad term "processor." Each of the elements shown in the present figures, e.g., any of the circuits/components shown in FIGS. 1-2 and FIGS. 4-7, can also include suitable interfaces for receiving, transmitting, and/or otherwise communicating data or information in a network environment so that they can communicate with, e.g., the data processing system 900 of another one of these elements.

In certain example implementations, mechanisms for implementing a phase shift module with an enhanced frequency multiplier and/or with temperature compensation as outlined herein may be implemented by logic encoded in one or more tangible media, which may be inclusive of non-transitory media, e.g., embedded logic provided in an ASIC, in DSP instructions, software (potentially inclusive of object code and source code) to be executed by a processor, or other similar machine, etc. In some of these instances, memory elements, such as e.g. the memory elements 904 shown in FIG. 9, can store data or information used for the operations described herein. This includes the memory elements being able to store software, logic, code, or processor instructions that are executed to carry out the activities described herein. A processor can execute any type of instructions associated with the data or information to achieve the operations detailed herein. In one example, the processors, such as e.g. the processor 902 shown in FIG. 9, could transform an element or an article (e.g., data) from one state or thing to another state or thing. In another example, the activities outlined herein may be implemented with fixed logic or programmable logic (e.g., software/computer instructions executed by a processor) and the elements identified herein could be some type of a programmable processor, programmable digital logic (e.g., an FPGA, a DSP, an erasable programmable read-only memory (EPROM), an electrically erasable programmable read-only memory (EEPROM)) or an ASIC that includes digital logic, software, code, electronic instructions, or any suitable combination thereof.

The memory elements 904 may include one or more physical memory devices such as, for example, local memory 908 and one or more bulk storage devices 910. The local memory may refer to RAM or other non-persistent memory device(s) generally used during actual execution of the program code. A bulk storage device may be implemented as a hard drive or other persistent data storage device. The processing system 900 may also include one or more cache memories (not shown) that provide temporary storage of at least some program code in order to reduce the number of times program code must be retrieved from the bulk storage device 910 during execution.

As shown in FIG. 9, the memory elements 904 may store an application 918. In various embodiments, the application 918 may be stored in the local memory 908, the one or more bulk storage devices 910, or apart from the local memory and the bulk storage devices. It should be appreciated that the data processing system 900 may further execute an operating system (not shown in FIG. 9) that can facilitate execution of the application 918. The application 918, being implemented in the form of executable program code, can be executed by the data processing system 900, e.g., by the processor 902. Responsive to executing the application, the data processing system 900 may be configured to perform one or more operations or method steps described herein.

Input/output (I/O) devices depicted as an input device 912 and an output device 914, optionally, can be coupled to the data processing system. Examples of input devices may include, but are not limited to, a keyboard, a pointing device such as a mouse, or the like. Examples of output devices may include, but are not limited to, a monitor or a display, speakers, or the like. In some embodiments, the output device 914 may be any type of screen display, such as plasma display, liquid crystal display (LCD), organic light emitting diode (OLED) display, electroluminescent (EL) display, or any other indicator, such as a dial, barometer, or LEDs. In some implementations, the system may include a driver (not shown) for the output device 914. Input and/or output devices 912, 914 may be coupled to the data processing system either directly or through intervening I/O controllers.

In an embodiment, the input and the output devices may be implemented as a combined input/output device (illustrated in FIG. 9 with a dashed line surrounding the input device 912 and the output device 914). An example of such a combined device is a touch sensitive display, also sometimes referred to as a "touch screen display" or simply "touch screen". In such an embodiment, input to the device may be provided by a movement of a physical object, such as e.g. a stylus or a finger of a user, on or near the touch screen display.

A network adapter 916 may also, optionally, be coupled to the data processing system to enable it to become coupled to other systems, computer systems, remote network devices, and/or remote storage devices through intervening private or public networks. The network adapter may comprise a data receiver for receiving data that is transmitted by said systems, devices and/or networks to the data processing system 900, and a data transmitter for transmitting data from the data processing system 900 to said systems, devices and/or networks. Modems, cable modems, and Ethernet cards are examples of different types of network adapter that may be used with the data processing system 900.

SELECT EXAMPLES

Example 1 provides a phase shift module for realizing a phase shift for RF signals in an RF system. The phase shift module includes a phase shifter and a frequency multiplier. The phase shifter is configured to receive an LO signal and output a phase-shifted signal (PS_LO) that is phase-shifted by a phase shift PS with respect to the local oscillator signal. The frequency multiplier is an enhanced frequency multiplier, configured to generate a frequency-multiplied signal (I_K_LO) having a frequency that is a multiple K of a frequency of the local oscillator signal (where K is greater than 1) based on the phase-shifted signal (PS_LO) and an inverted phase-shifted signal (I_PS_LO or I_Gm_PS_LO) (i.e., a signal that is an inverted version of the phase-shifted signal).

Example 2 provides the phase shift module according to example 1, where the phase-shifted signal PS_LO is a differential signal, and the frequency multiplier includes a switching arrangement configured to invert the phase-shifted signal to generate the inverted phase-shifted signal (I_PS_LO) by reversing a polarity of each of two lines of the differential phase-shifted signal.

Example 3 provides the phase shift module according to example 2, where the frequency multiplier is a Gilbert cell frequency multiplier that includes a switching core and a transconductance amplifier, the switching arrangement is configured to provide the inverted phase-shifted signal to the switching core, and the transconductance amplifier is configured to receive the phase-shifted signal.

Example 4 provides the phase shift module according to example 2, where the frequency multiplier is a Gilbert cell frequency multiplier that includes a switching core and a transconductance amplifier, the switching arrangement is configured to provide the inverted phase-shifted signal to the transconductance amplifier, and the switching core is configured to receive the phase-shifted signal.

Example 5 provides the phase shift module according to example 1, where the frequency multiplier is a Gilbert cell frequency multiplier that includes a switching core and a transconductance amplifier, and the frequency multiplier generating the frequency-multiplied signal based on the phase-shifted signal and the inverted phase-shifted signal includes the frequency multiplier generating the frequency-multiplied signal based on providing the phase-shifted signal to each of the switching core and the transconductance amplifier and based on providing to the switching core an inverted transconductance amplifier signal, where the inverted transconductance amplifier signal is an inverted version of a signal generated by the transconductance amplifier based on the phase-shifted signal provided thereto.

Example 6 provides the phase shift module according to example 5, where the signal generated by the transconductance amplifier is a differential signal, and the frequency multiplier includes a switching arrangement configured to invert the signal generated by the transconductance amplifier to generate the inverted transconductance amplifier signal by reversing a polarity of each of two lines of the signal generated by the transconductance amplifier.

Example 7 provides the phase shift module according to any one of the preceding examples, where the frequency-multiplied signal is a first frequency-multiplied signal, and the frequency multiplier is further configured to generate a second frequency-multiplied signal having a frequency that is a multiple K of a frequency of the LO signal based on the phase-shifted signal, where the second frequency-multiplied signal is an inverted version of the first frequency-multiplied signal.

Example 8 provides the phase shift module according to example 7, where the frequency multiplier is configured to generate the first frequency-multiplied signal in response to receiving a first control signal from a control logic, and the frequency multiplier is configured to generate the second frequency-multiplied signal in response to receiving a second control signal from the control logic. In this manner, the control logic can control whether, at a given time, the frequency multiplier generates the first or the second frequency-multiplied signal.

Example 9 provides the phase shift module according to any one of examples 1-8, where the phase shifter is configured to phase shift the LO signal by the phase shift PS that is not greater than 90 degrees.

Example 10 provides the phase shift module according to example 9, where the multiple K is equal to 2 (i.e., the frequency multiplier is a frequency doubler).

Example 11 provides the phase shift module according to any one of examples 1-8, where the phase shifter is configured to phase shift the LO signal by the phase shift PS that is not greater than 45 degrees.

Example 12 provides the phase shift module according to example 11, where the multiple K is equal to 4 (i.e., the frequency multiplier is a frequency quadrupler).

Example 13 provides the phase shift module according to any one of the preceding examples, further including a temperature compensation circuit configured to ensure that the phase shift applied by the phase shifter to the LO signal is compensated for temperature variations.

Example 14 provides an antenna apparatus for calibrating one or more of a plurality of antenna elements of an antenna array using one or more probes, where each of the one or more probes includes an element configured to wirelessly transmit and/or receive RF signals. The antenna apparatus includes a UDC circuit including one or more frequency mixers, and further includes a phase shift module. The phase shift module includes a phase shifter configured to receive an LO signal and output a phase-shifted signal (PS_LO) that is phase-shifted by a phase shift PS with respect to the local oscillator signal, and a frequency multiplier configured to generate a frequency-multiplied signal (I_K_LO) having a frequency that is a multiple K of a frequency of the local oscillator signal (where K is greater than 1) based on the phase-shifted signal (PS_LO) and an inverted phase-shifted signal (I_PS_LO) (i.e., a signal that is an inverted version of the phase-shifted signal). The one or more frequency mixers of the UDC circuit are configured to perform frequency mixing using the frequency-multiplied signal generated by the frequency multiplier.

Example 15 provides the antenna apparatus according to example 14, where the UDC circuit is communicatively coupled with the antenna array.

Example 16 provides the antenna apparatus according to examples 14 or 15, further including one or more beamformers, communicatively coupled to each of the UDC circuit and the antenna array.

Example 17 provides the antenna apparatus according to any one of examples 14-16, where the one or more frequency mixers, the phase shifter, and the frequency multiplier are provided on a single die.

Example 18 provides the antenna apparatus according to example 17, where the die includes a first face and a second face, the second face being opposite to the first face, the plurality of antenna elements and the one or more probes are at the first face of the die, and the one or more frequency mixers, the phase shifter, and the frequency multiplier are at the second face of the die.

Example 19 provides the antenna apparatus according to any one of examples 14-18, further including a calibration arrangement configured to identify one or more relationships between at least one of the antenna elements and the at least one probe coupled to the UDC circuit, and determine calibration information for calibrating one or more of the antenna elements based on the one or more relationships, where the phase shift PS introduced to the LO signal by the phase shifter is based on the calibration information.

Example 20 provides the antenna apparatus according to example 19, where determining the calibration information includes determining at least one of a relative amplitude relationship or a relative phase relationship among two or more of the plurality of antenna elements.

Example 21 provides an antenna apparatus for wirelessly receiving and transmitting RF signals using a plurality of antenna elements of an antenna array. The antenna apparatus includes a UDC circuit including one or more frequency mixers. The antenna apparatus also includes a phase shift module and a temperature compensation circuit. The temperature compensation circuit is configured to determine a temperature compensation to be applied to a phase shift to be applied by the phase shift module. The phase shift module is configured to apply the phase shift to an LO signal to generate a phase-shifted LO signal, the phase shift based on the temperature compensation determined by the temperature compensation circuit and a target phase shift to be applied. The one or more frequency mixers of the UDC circuit are configured to perform frequency mixing using the phase-shifted LO signal generated by the phase shift module.

Example 22 provides the antenna apparatus according to example 21, where the temperature compensation circuit is configured to determine the temperature compensation based on a temperature signal indicative of a temperature of one or more of the phase shift module, the one or more frequency mixers, and the plurality of antenna elements of the antenna array.

Example 23 provides the antenna apparatus according to example 22, further including a temperature sensor configured to generate the temperature signal.

Example 24 provides the antenna apparatus according to any one of examples 21-23, where the temperature compensation circuit is configured to receive measurements performed at at least two different temperatures, where the measurements are indicative of a phase of a signal to be transmitted at an output of the UDC circuit or a phase of a signal transmitted by one or more antenna elements of the antenna array, and/or a phase of a signal received by one or more antenna elements of the antenna array at an output of the one or more antenna elements or a phase of a signal generated by the UDC circuit based on the signal received by the one or more antenna elements. The temperature compensation circuit is further configured to determine a phase shift function indicative of phase shift variations as a function of temperature based on the received measurements, and determine the temperature compensation to be applied to the phase shift to be applied by the phase shift module based on the phase shift function.

Example 25 provides the antenna apparatus according to example 24, where the temperature compensation circuit is configured to determine the temperature compensation further based on a temperature signal indicative of a temperature of one or more of the phase shift module, the one or more frequency mixers, and the plurality of antenna elements of the antenna array.

Example 26 provides a method of operating a phase shift module for realizing phase shifts in RF signals of an RF system. The method includes using a phase shifter of the phase shift module to generate a phase-shifted signal PS_LO based on an LO signal; and configuring the phase shift module to operate in a first mode or in a second mode. When the phase shift module operates in the first mode, the method further includes using a frequency multiplier of the phase shift module to generate a frequency-multiplied signal K_LO based on the phase-shifted signal PS_LO. When the phase shift module operates in the second mode, the method further includes using the frequency multiplier of the phase shift module to generate a frequency-multiplied signal I_K_LO based on the phase-shifted signal PS_LO and an inverted version of the phase-shifted signal PS_LO.

Example 27 provides a non-transitory computer-readable storage medium including instructions for execution which, when executed by a processor, are operable to perform operations of the method according to example 26.

In further examples, the non-transitory computer-readable storage medium according to example 27 may further include instructions operable to perform operations performed by any parts of the phase shift module and/or antenna array according to any one of the preceding examples.

Variations and Implementations

While embodiments of the present disclosure were described above with references to exemplary implementations as shown in FIGS. 1-9, a person skilled in the art will realize that the various teachings described above are applicable to a large variety of other implementations. For example, the same principles may be applied to radar systems, automotive radar, frequency generation circuits (e.g., phase-locked loop, etc.)

In certain contexts, the features discussed herein can be applicable to automotive systems, medical systems, scientific instrumentation, wireless and wired communications, radio, radar, and digital-processing-based systems.

In the discussions of the embodiments above, components of a system, such as phase shifters, frequency mixers, amplifiers, and/or other components can readily be replaced, substituted, or otherwise modified in order to accommodate particular circuitry needs. Moreover, it should be noted that the use of complementary electronic devices, hardware, software, etc., offer an equally viable option for implementing the teachings of the present disclosure related to a phase shift module with an enhanced frequency multiplier and/or temperature compensation as described herein.

Parts of various systems for implementing a phase shift module with an enhanced frequency multiplier and/or temperature compensation as proposed herein can include electronic circuitry to perform the functions described herein. In some cases, one or more parts of the system can be provided by a processor specially configured for carrying out the functions described herein. For instance, the processor may include one or more application specific components, or may include programmable logic gates which are configured to carry out the functions describe herein. The circuitry can operate in analog domain, digital domain, or in a mixed-signal domain. In some instances, the processor may be configured to carrying out the functions described herein by executing one or more instructions stored on a non-transitory computer-readable storage medium.

In one example embodiment, any number of electrical circuits of the present figures may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of DSPs, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the present figures may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often RF functions: all of which may be provided on a single chip substrate. Other embodiments may include a multi-chip-module (MCM), with a plurality of separate ICs located within a single electronic package and configured to interact closely with each other through the electronic package.

It is also imperative to note that all of the specifications, dimensions, and relationships outlined herein (e.g., the number of components shown in the systems of FIGS. 1-2, FIGS. 4-9, etc.) have only been offered for purposes of example and teaching only. Such information may be varied considerably without departing from the spirit of the present disclosure, or the scope of the appended claims. It should be appreciated that the system can be consolidated in any suitable manner. Along similar design alternatives, any of the illustrated circuits, components, modules, and elements of the present figures may be combined in various possible configurations, all of which are clearly within the broad scope of this specification. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

It is also important to note that the functions related to realizing a phase shift using a phase shift module with an enhanced frequency multiplier and/or temperature compensation as proposed herein illustrate only some of the possible functions that may be executed by, or within, RF systems. Some of these operations may be deleted or removed where appropriate, or these operations may be modified or changed considerably without departing from the scope of the present disclosure. Substantial flexibility is provided by embodiments described herein in that any suitable arrangements, chronologies, configurations, and timing mechanisms may be provided without departing from the teachings of the present disclosure.

The invention claimed is:

1. A phase shift module for a radio frequency system, comprising:
    a phase shifter configured to receive a local oscillator signal and output a phase-shifted signal that is phase-shifted by a phase shift with respect to the local oscillator signal; and
    a frequency multiplier configured to generate a frequency-multiplied signal having a frequency that is a multiple K of a frequency of the local oscillator signal, where K is greater than 1, based on the phase-shifted signal and further based on an inverted phase-shifted signal,
wherein:
the phase-shifted signal is a differential signal, and
the phase shift module is configured to generate the inverted phase-shifted signal by reversing a polarity of each of two lines of the differential phase-shifted signal.

2. The phase shift module according to claim 1, wherein:
the frequency multiplier includes a switching core and a transconductance amplifier,
the switching core is configured to operate on the inverted phase-shifted signal, and
the transconductance amplifier is configured to operate on the phase-shifted signal.

3. The phase shift module according to claim 1, wherein:
the frequency multiplier includes a switching core and a transconductance amplifier,
the transconductance amplifier is configured to operate on the inverted phase-shifted signal, and
the switching core is configured to operate on the phase-shifted signal.

4. The phase shift module according to claim 1, wherein:
the frequency multiplier includes a switching core and a transconductance amplifier, and
the frequency multiplier configured to generate the frequency-multiplied signal based on the phase-shifted signal and the inverted phase-shifted signal includes the frequency multiplier configured to generate the frequency-multiplied signal by providing the phase-shifted signal to each of the switching core and the transconductance amplifier and by providing to the switching core an inverted transconductance amplifier signal, where the inverted transconductance amplifier signal is an inverted version of a signal generated by the transconductance amplifier based on the phase-shifted signal provided thereto.

5. The phase shift module according to claim 4, wherein:
the signal generated by the transconductance amplifier is a differential signal, and
the phase shift module is configured to generate the inverted phase-shifted signal by reversing the polarity of the each of two lines of the differential phase-shifted signal by including a switching arrangement configured to invert the signal generated by the transconductance amplifier to generate the inverted transconductance amplifier signal by reversing a polarity of each of two lines of the signal generated by the transconductance amplifier.

6. The phase shift module according to claim 1, wherein:
the frequency-multiplied signal is a first frequency-multiplied signal, and
the frequency multiplier is further configured to generate a second frequency-multiplied signal having a frequency that is a multiple K of a frequency of the local oscillator signal based on the phase-shifted signal, where the second frequency-multiplied signal is an inverted version of the first frequency-multiplied signal.

7. The phase shift module according to claim 6, wherein:
the frequency multiplier is configured to generate the first frequency-multiplied signal in response to receiving a first control signal, and
the frequency multiplier is configured to generate the second frequency-multiplied signal in response to receiving a second control signal.

8. The phase shift module according to claim 1, wherein the phase shifter is configured to phase shift the local oscillator signal by the phase shift that is not greater than 90 degrees, and wherein the multiple K is equal to 2.

9. The phase shift module according to claim 1, wherein the phase shifter is configured to phase shift the local oscillator signal by the phase shift that is not greater than 45 degrees, and wherein the multiple K is equal to 4.

10. The phase shift module according to claim 1, further comprising a temperature compensation circuit configured to enable compensation of the phase shift for temperature variations.

11. An antenna apparatus,
an upconverter and/or downconverter (UDC) circuit comprising one or more frequency mixers; and
a phase shift module, comprising:
a phase shifter configured to receive a local oscillator signal and generate a phase-shifted signal that is phase-shifted by a phase shift with respect to the local oscillator signal, and
a frequency multiplier configured to generate a frequency-multiplied signal having a frequency that is a multiple K of a frequency of the local oscillator signal, where K is greater than 1, based on the phase-shifted signal and further based on an inverted phase-shifted signal,
wherein the one or more frequency mixers of the UDC circuit are configured to perform frequency mixing using the frequency-multiplied signal generated by the frequency multiplier.

12. The antenna apparatus according to claim 11, wherein the one or more frequency mixers, the phase shifter, and the frequency multiplier are provided on a single die.

13. The antenna apparatus according to claim 11, further comprising a calibration arrangement configured to:
identify one or more relationships between at least one of antenna elements of an antenna array and a probe coupled to the UDC circuit and configured to wirelessly transmit and/or receive radio frequency signals, and
enable calibration of one or more of the antenna elements using calibration information determined based on the one or more relationships.

14. The antenna apparatus according to claim 13, wherein determining the calibration information includes determining at least one of a relative amplitude relationship or a relative phase relationship among two or more of the plurality of antenna elements.

15. The antenna apparatus according to claim 11, wherein:
the phase-shifted signal is a differential signal, and
the phase shift module is configured to generate the inverted phase-shifted signal by reversing a polarity of each of two lines of the differential phase-shifted signal.

16. The antenna apparatus according to claim 11, wherein:
the frequency-multiplied signal is a first frequency-multiplied signal, and
the frequency multiplier is further configured to generate a second frequency-multiplied signal having a frequency that is a multiple K of a frequency of the local oscillator signal based on the phase-shifted signal, where the second frequency-multiplied signal is an inverted version of the first frequency-multiplied signal.

17. The antenna apparatus according to claim 11, wherein the phase shifter is configured to phase shift the local oscillator signal by the phase shift that is not greater than 45 degrees, and wherein the multiple K is equal to 4.

18. The antenna apparatus according to claim 13, wherein the phase shift introduced to the local oscillator signal by the phase shifter is based on the calibration information.

19. The antenna apparatus according to claim 13, further comprising the antenna array and the probe.

20. An antenna apparatus, comprising:
a temperature compensation circuit, configured to determine a phase shift function indicative of phase shift variations as a function of temperature based on measurements performed at two different temperatures, the measurements indicative of at least one of:
   a phase of a signal to be transmitted, measured at an output of an upconverter and/or downconverter (UDC) circuit,
   a phase of a signal transmitted by at least one antenna element of an antenna array,
   a phase of a signal received by one or more antenna elements of the antenna array, measured at an output of the one or more antenna elements, and
   a phase of a signal generated by the UDC circuit based on the signal received by the one or more antenna elements; and
a phase shift module, configured to apply a phase shift to a local oscillator signal to generate a phase-shifted local oscillator signal, the phase shift based on the phase shift function.

21. The antenna apparatus according to claim 20, wherein the temperature compensation circuit is configured to determine the temperature compensation based on a temperature signal indicative of a temperature of one or more of the phase shift module, one or more frequency mixers of the UDC circuit, and one or more antenna elements of the antenna array.

22. The antenna apparatus according to claim 21, further comprising a temperature sensor configured to generate the temperature signal.

23. The antenna apparatus according to claim 20, wherein the phase shift is further based on a temperature signal indicative of a temperature of one or more of the phase shift module, one or more frequency mixers of the UDC circuit, and one or more antenna elements of the antenna array.

24. The antenna apparatus according to claim 20, wherein:
   the antenna apparatus further includes an upconverter and/or downconverter (UDC) circuit comprising one or more frequency mixers,
   the one or more frequency mixers of the UDC circuit are configured to perform frequency mixing using the phase-shifted local oscillator signal generated by the phase shift module.

25. The antenna apparatus according to claim 20, further comprising the antenna array comprising a plurality of antenna elements.

* * * * *